(12) United States Patent
White

(10) Patent No.: US 9,985,842 B2
(45) Date of Patent: May 29, 2018

(54) BUS BAR POWER ADAPTER FOR AC-INPUT, HOT-SWAP POWER SUPPLIES

(71) Applicant: Vapor IO Inc., Austin, TX (US)

(72) Inventor: Steven White, Austin, TX (US)

(73) Assignee: Vapor IO Inc., Austin, TX (US)

( * ) Notice: Subject to any disclaimer, the term of this patent is extended or adjusted under 35 U.S.C. 154(b) by 81 days.

(21) Appl. No.: 15/257,105

(22) Filed: Sep. 6, 2016

(65) Prior Publication Data

US 2017/0126143 A1    May 4, 2017

Related U.S. Application Data

(60) Provisional application No. 62/248,788, filed on Oct. 30, 2015, provisional application No. 62/275,909, filed on Jan. 7, 2016.

(51) Int. Cl.
| | | |
|---|---|---|
| H04L 12/24 | (2006.01) | |
| G06K 7/10 | (2006.01) | |
| G06K 7/14 | (2006.01) | |
| G06K 19/06 | (2006.01) | |
| G06K 19/077 | (2006.01) | |
| H04L 29/08 | (2006.01) | |
| H02J 7/00 | (2006.01) | |
| H02J 9/06 | (2006.01) | |
| H02M 3/158 | (2006.01) | |

(Continued)

(52) U.S. Cl.
CPC .......... *H04L 41/12* (2013.01); *G06K 7/10366* (2013.01); *G06K 7/10881* (2013.01); *G06K 7/1413* (2013.01); *G06K 19/06028* (2013.01); *G06K 19/07758* (2013.01); *H01R 12/721* (2013.01); *H01R 25/16* (2013.01); *H02H 7/20* (2013.01); *H02J 7/0052* (2013.01); *H02J 9/061* (2013.01); *H02M 3/158* (2013.01); *H02M 7/04* (2013.01); *H02M 7/44* (2013.01); *H04L 67/10* (2013.01); *H04L 67/12* (2013.01); *H04L 67/18* (2013.01); *H04L 67/22* (2013.01); *H05K 5/0069* (2013.01); *H05K 7/1488* (2013.01); *H05K 7/1498* (2013.01); *H05K 7/20736* (2013.01); *H05K 7/20836* (2013.01); *H04L 12/10* (2013.01); *H04W 4/023* (2013.01)

(58) Field of Classification Search
CPC ...................................................... H04L 41/12
See application file for complete search history.

(56) References Cited

U.S. PATENT DOCUMENTS 5,063,475 A    11/1991    Balan
6,133,526 A    10/2000    Lebo et al.
(Continued)

OTHER PUBLICATIONS

'ATX', Wikipedia, https://en.wikipedia.org/wiki/ATX, Aug. 30, 2016, pp. 1 to 17.

(Continued)

*Primary Examiner* — Mohammed Rehman

(74) *Attorney, Agent, or Firm* — Pillsbury Winthrop Shaw Pittman LLP

(57) ABSTRACT

Provided is a device, including: a first interface to couple the device to a direct current (DC) bus-bar power interface of a rack configured to hold computing equipment; a second interface to couple the device to an alternative (AC) power input interface of the computing equipment; a powerline modem; and a controller operative to execute commands form the powerline modem.

21 Claims, 16 Drawing Sheets

(51) Int. Cl.
*H02M 7/44* (2006.01)
*H01R 12/72* (2011.01)
*H01R 25/16* (2006.01)
*H02H 7/20* (2006.01)
*H02M 7/04* (2006.01)
*H05K 5/00* (2006.01)
*H05K 7/14* (2006.01)
*H05K 7/20* (2006.01)
*H04L 12/10* (2006.01)
*H04W 4/02* (2018.01)

(56) References Cited

U.S. PATENT DOCUMENTS

| | | | |
|---|---|---|---|
| 7,133,289 B2 | 11/2006 | Arippol | |
| 7,426,110 B2 | 9/2008 | Malone et al. | |
| 7,508,663 B2 | 3/2009 | Coglitore | |
| 7,573,715 B2 | 8/2009 | Mojaver et al. | |
| 7,688,593 B2 | 3/2010 | Byers et al. | |
| 7,697,305 B2 | 4/2010 | Meyer et al. | |
| 7,757,107 B2* | 7/2010 | Goodrum | G06F 1/3203 713/300 |
| 7,907,402 B2 | 3/2011 | Caveney | |
| 7,907,409 B2* | 3/2011 | Wyatt | H05K 7/20809 165/104.26 |
| 8,297,067 B2 | 10/2012 | Keisling et al. | |
| 8,320,125 B1 | 11/2012 | Hamburgen et al. | |
| 8,867,204 B1 | 10/2014 | Gardner | |
| 9,001,456 B2 | 4/2015 | Campbell et al. | |
| 9,430,008 B2* | 8/2016 | Li | G06F 1/26 |
| 2002/0098792 A1 | 7/2002 | Hsiao | |
| 2002/0101753 A1 | 8/2002 | Lin | |
| 2002/0149911 A1 | 10/2002 | Bishop et al. | |
| 2002/0191359 A1* | 12/2002 | Chen | H02H 9/001 361/58 |
| 2003/0031449 A1 | 2/2003 | Simmons et al. | |
| 2003/0126475 A1* | 7/2003 | Bodas | G06F 1/28 713/300 |
| 2004/0132398 A1 | 7/2004 | Sharp et al. | |
| 2005/0201073 A1 | 9/2005 | Pincu et al. | |
| 2006/0209475 A1 | 9/2006 | Cabrera et al. | |
| 2006/0215363 A1 | 9/2006 | Shipley et al. | |
| 2007/0064383 A1 | 3/2007 | Tanaka et al. | |
| 2008/0151497 A1 | 6/2008 | Lai et al. | |
| 2009/0024764 A1 | 1/2009 | Atherton et al. | |
| 2009/0244830 A1* | 10/2009 | Wyatt | H05K 7/20809 361/679.47 |
| 2009/0251860 A1 | 10/2009 | Belady et al. | |
| 2009/0308579 A1 | 12/2009 | Johnson et al. | |
| 2010/0151781 A1 | 6/2010 | Slessman et al. | |
| 2010/0277143 A1 | 11/2010 | Kudo et al. | |
| 2010/0317278 A1 | 12/2010 | Novick | |
| 2011/0006607 A1 | 1/2011 | Kwon et al. | |
| 2011/0012564 A1* | 1/2011 | Yang | H02J 7/0031 320/162 |
| 2011/0014862 A1 | 1/2011 | Honold et al. | |
| 2011/0080755 A1 | 4/2011 | Huang et al. | |
| 2011/0116226 A1 | 5/2011 | Yang | |
| 2011/0277967 A1* | 11/2011 | Fried | F28D 15/0266 165/104.26 |
| 2011/0317971 A1 | 12/2011 | Zhang et al. | |
| 2012/0016290 A1 | 1/2012 | Shin | |
| 2012/0103843 A1 | 5/2012 | Wei et al. | |
| 2012/0111817 A1 | 5/2012 | Sweeny et al. | |
| 2012/0128507 A1 | 5/2012 | Scheidler | |
| 2012/0134096 A1 | 5/2012 | Zhang | |
| 2012/0166693 A1 | 6/2012 | Weinstock et al. | |
| 2013/0107450 A1 | 5/2013 | Zhang et al. | |
| 2013/0120931 A1 | 5/2013 | Sankar et al. | |
| 2013/0133350 A1 | 5/2013 | Reytblat | |
| 2013/0205069 A1 | 8/2013 | Delfatti, Jr. et al. | |
| 2014/0113539 A1 | 4/2014 | Dickinson | |
| 2014/0137491 A1 | 5/2014 | Somani et al. | |
| 2014/0173302 A1 | 6/2014 | Kudo et al. | |
| 2014/0177163 A1 | 6/2014 | Wiley | |
| 2014/0185225 A1 | 7/2014 | Wineland | |
| 2014/0218974 A1* | 8/2014 | Chang | H02M 1/10 363/21.01 |
| 2014/0268528 A1* | 9/2014 | Mick | H05K 7/1491 361/679.02 |
| 2014/0268564 A1* | 9/2014 | Sagneri | H05K 7/209 361/692 |
| 2014/0280589 A1* | 9/2014 | Atkinson | H04L 65/403 709/204 |
| 2014/0297855 A1 | 10/2014 | Moore et al. | |
| 2015/0090679 A1* | 4/2015 | Obernesser | H05K 7/1488 211/26 |
| 2015/0124378 A1* | 5/2015 | Okkoso | H05K 7/1492 361/624 |
| 2015/0129514 A1 | 5/2015 | Bourdoncle et al. | |
| 2015/0289405 A1 | 10/2015 | Stewart et al. | |
| 2016/0043521 A1* | 2/2016 | Hofer | H01R 13/187 29/876 |
| 2016/0107312 A1 | 4/2016 | Morrill et al. | |

OTHER PUBLICATIONS

'I²C', Wikipedia, https://en.wikipedia.org/wiki/I%C2%B2C, Aug. 26, 2016, pp. 1 to 18.
'Power Supply >> Open Compute Project', http://www.opencompute.org/projects/powersupply/, Sep. 6, 2016, pp. 1 to 3.
'Power Supply with Programmable Output Voltage and Protection for Position Encoder Interfaces', TI Designs, TIDU533—Sep. 2014, pp. 1 to 56.
'Power supply unit (computer)', Wikipedia, https://en.wikipedia.org/wiki/Power_supply_unit_(computer), Sep. 3, 2016, pp. 1 to 18.
'Wireless data centers could be faster, cheaper, greener', http://www.news.cornell.edu/stories/2012/09/wireless-data-centers-could-be-faster-cheaper-greener, Sep. 26, 2012, pp. 1 to 2.
'Wild New Design: Data Center in a Silo', http://www.datacenterknowledge.com/archives/2009/12/10/wild-new-design-data-center-in-a-silo/, Dec. 10, 2009, pp. 1 to 6.
'Calcul gets creative with data center cooling design', http://searchdatacenter.techtarget.com/photostory/2240169084/New-book-takes-you-inside-unique-energy-efficient-data-centers/3/Calcul-gets-creative-with-data-center-cooling-design, Oct. 23, 2012, pp. 1 to 3.
International Search Report & Written Opinion for Related PCT Application PCT/US2016/021515, dated Jun. 17, 2016, pp. 1 to 13.
International Search Report & Written Opinion for Related PCT Application PCT/US2016/021521, dated Jun. 20, 2016, pp. 1 to 13.
International Search Report & Written Opinion for Related PCT Application PCT/US2016/034328, dated Aug. 24, 2016, pp. 1 to 12.
Non-Final Office Action for Related U.S. Appl. No. 15/065,201, dated Aug. 12, 2016, pp. 1 to 18.
Non-Final Office Action for Related U.S. Appl. No. 15/065,181, dated Aug. 12, 2016, pp. 1 to 25.
Non-Final Office Action for Related U.S. Appl. No. 15/165,590, dated Aug. 30, 2016, pp. 1 to 24.
Final Office Action for Related U.S. Appl. No. 15/065,201, dated Nov. 4, 2016, pp. 1 to 27.

* cited by examiner

BUS BAR POWER ADAPTER FOR AC-INPUT, HOT-SWAP POWER SUPPLIES

CROSS-REFERENCE TO RELATED APPLICATIONS

The present application claims the benefit of the following U.S. Provisional Patent Applications: U.S. 62/248,788, filed 30 Oct. 2015; and U.S. 62/275,909, filed 7 Jan. 2016. The entire content of each parent application is incorporated by reference in its entirety.

BACKGROUND

1. Field

The present invention relates generally to bus bar power adapters and, more specifically to bus bar power adapters for alternative current (AC)-input, hot-swap power supplies.

2. Description of the Related Art

Computer-equipment racks, such as server racks, are generally used to house and in some cases interconnect collections of computing devices, like servers and associated storage, power supplies, network switches, and the like. In many cases, the computing devices are relatively numerous and arranged in relatively-dense arrays due to the cost of space appropriate to store such computing devices and the desire to reduce latency by having the devices close to one another.

SUMMARY

The following is a non-exhaustive listing of some aspects of the present techniques. These and other aspects are described in the following disclosure.

Some aspects include a device, including: a first interface to couple the device to a direct current (DC) bus-bar power interface of a rack configured to hold computing equipment; a second interface to couple the device to an alternative (AC) power input interface of the computing equipment; a powerline modem; and a controller operative to execute commands form the powerline modem.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
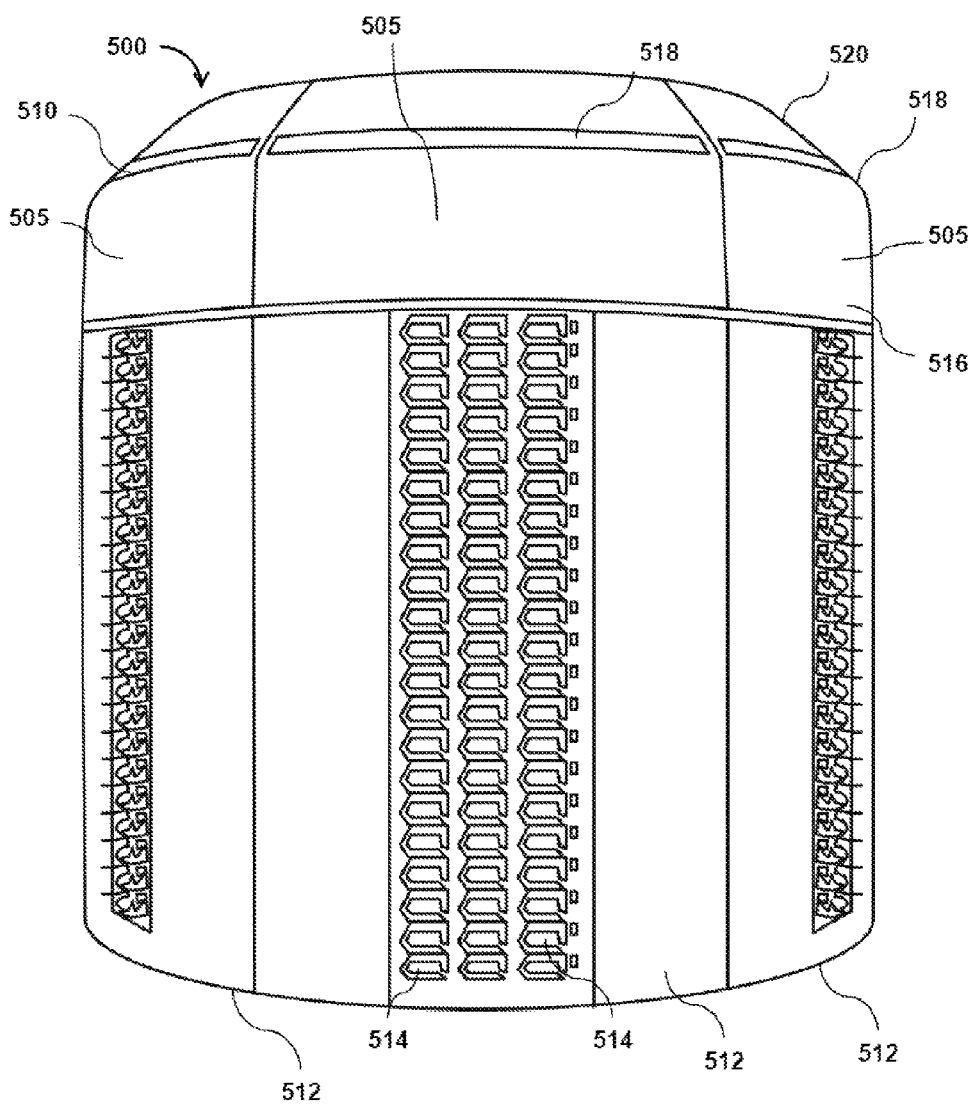
FIG. 1 illustrates an example of a cylindrical datacenter chamber, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center and power supply design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Often, rack-mounted computing devices are configured to receive power in the form of alternating current (AC) power. Many require power wiring and power distribution units (PDUs) for AC distribution in the rack. Generally, most AC input power supplies used in datacenter computing equipment receive AC power and output DC power to internal components of the computing equipment.

Yet many newer rack designs (e.g., some forms of the Open Compute Open Rack designs) are configured to supply direct-current (DC) power, in some cases without also providing AC power. As a result, it can be difficult to use computing equipment configured for AC power in racks that instead provide DC power. Moreover, the supplied power can be unreliable at times, potentially impeding operation of the computing equipment. And in some cases, the racks and computing equipment must be powered down in order to change the computing equipment, making maintenance burdensome and expensive.

Some embodiments may mitigate some, and in some cases, all of these issues. In some embodiments, a bus bar power adapter described below allows traditional AC voltage servers to be safely powered, and in some cases, controlled or monitored, via a DC power source, such as a DC bus bar in the examples of computing racks described below. Further, some embodiments may be consistent with form factors of earlier designs to support retrofits of existing equipment. To provide a similar power source, the bus bar power adapter of some embodiments accepts 12 Volt DC power from a DC bus bar and provides the same type of output mating connection as the AC input power supply for the server, or other computing equipment. In some embodiments, the AC power supply in the server is removed and replaced by a bus bar power adapter.

In some cases, the bus bar power adapter may be housed in an enclosure that mimics (e.g., is a subset of the form factor and has similar mechanical and electrical mating interfaces) the AC power supply, so that the bus bar power adapter slides in and locks the same way as the AC power supply. The bus bar power adapter may supply DC power to computing equipment, without performing AC to DC power conversion in some cases. The bus bar power adapter may also provide under voltage, overvoltage, and overcurrent protection, in some embodiments. In some cases, the bus bar power adapter may support power management bus (PM-Bus) for external real time (e.g., with updates output within seconds of an event) monitoring of parameters such as power in, power out, voltage in, voltage out, and temperature. That said, not all of these benefits are provided by all embodiments, as several inventions are described, and they are independently useful and may be used in environments where some problems persist while others are addressed.

In some cases, these techniques are implemented the context of a computing environment described below with reference to FIGS. 1-13 and 16, though embodiments of the bus bar power adapter have applicability outside this context, e.g., in traditional rack designs, such as those with linear racks having a hot aisle.

Figure 3:
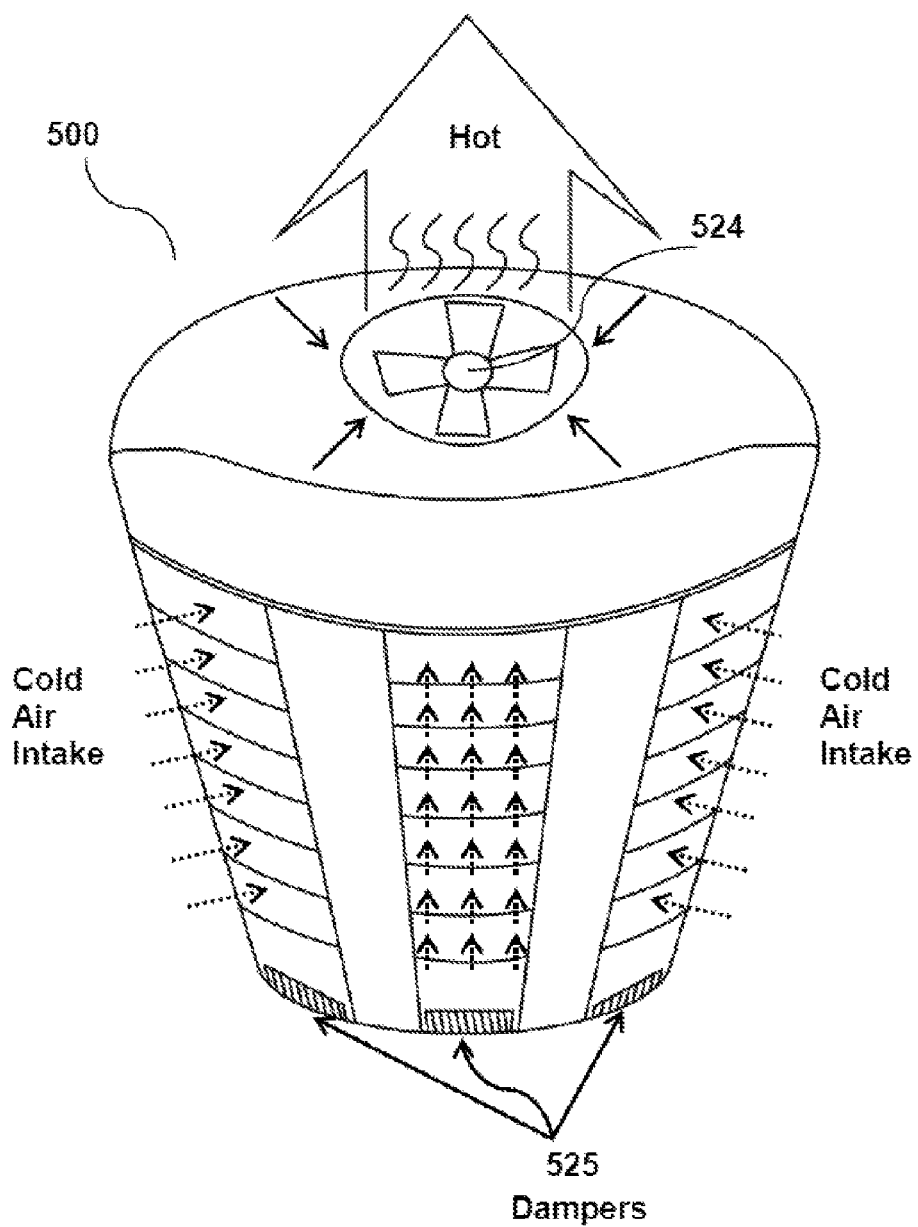
FIGS. 3-4 illustrate operation of the cylindrical datacenter chamber of FIG. 1, in accordance with some embodiments.
Figure 4:
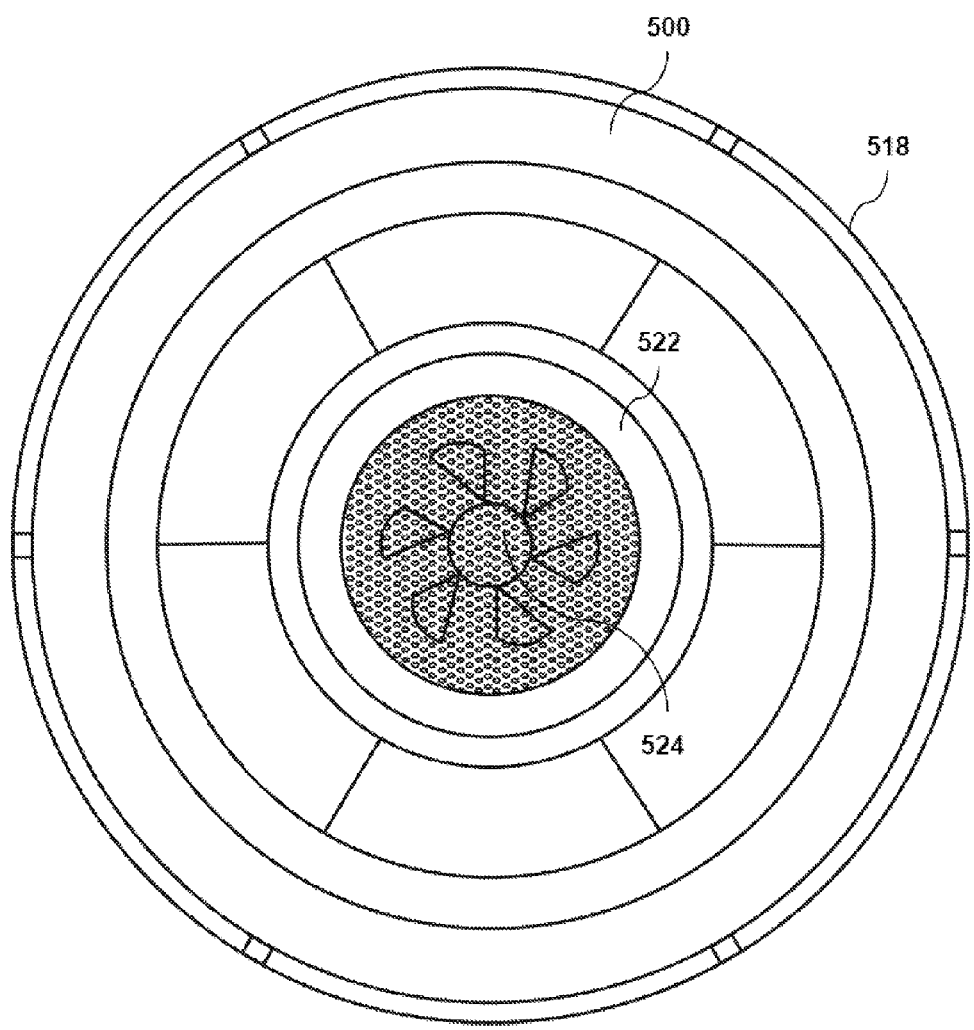
Figure 5:
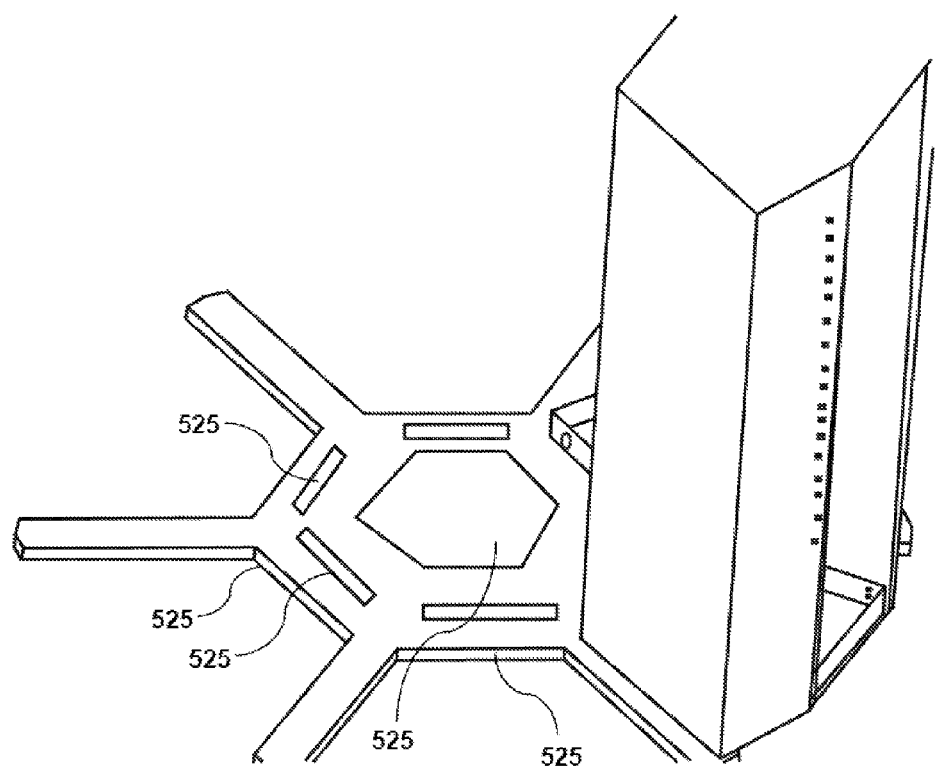
FIG. 5 illustrates examples of components of the cylindrical datacenter chamber of FIG. 1, in accordance with some embodiments.

FIG. 1 depicts an embodiment of a datacenter chamber 500 in accordance with some of the present techniques. In some embodiments, datacenter 500 includes a collection of adjacent racks arrayed non-linearly (e.g., in a circle, oval, square, etc.) so as to at least partially define an interior chamber (e.g., by fully enclosing the interior chamber in a horizontal plane, or by partially enclosing the interior chamber, like by defining a concave area in the plane). The interior chamber defines a compartment through which cooling fluid flows, in some cases having a substantially an empty space through which cooling fluid like air may flow. Some embodiments may provide for a generally cylindrical datacenter chamber 500, having a plurality of wedge racks, each with a stack of vertically arrayed, outward facing servers. Wedge-shaped racks generally have an outer portion (further from the interior chamber) that is wider than an inner portion (adjacent the interior chamber). This arrangement is expected to allow for relatively easy access to equipment on the wedge racks (e.g., for maintenance, cabling, installation, etc.) An integrated cooling or ventilation system may be provided by which air is drawn or pushed through the inner chamber (e.g., via fans near the top or bottom of the inner chamber as shown in FIGS. 3-4 and described below). Additionally or alternatively, in some embodiments, ducting may be coupled to the column, the data center pressurized, and air may flow through the ducting to a region at a lower pressure (or the ducting may be driven to a lower pressure than a data center at ambient air pressure). Finally, arranging can be challenging due to the weight of the racks, particularly when the body of the racks serves to constrain and direct airflow, often leading to relatively narrow tolerances for mating between adjacent racks. Some embodiments may include a guiding and seating system for aligning the racks during assembly, as described below.

In some cases, the chamber may form a relatively self-contained unit, having cooling infrastructure independent of building-provided heating, ventilation, and air conditioning (HVAC). In some cases, the chamber may also have power conditioning circuitry (e.g., rectifiers, low-pass filters, and surge-protectors) and back-up power supplies (e.g., batteries). In some embodiments, each chamber includes an integrated, self-contained compute fabric by which computing devices are interconnected. A relatively self-contained chamber 500 as described above may provide benefits such as easy shipping, easy access to components within the chamber, cost effective heat and humidity control, and independency from other infrastructure (e.g., datacenter building, other datacenter units, etc.). That said, several independently useful inventions are described, so not all embodiments provide all of these benefits.

FIG. 1 shows an example of a chamber 500 including a plurality of racks 505 configured to hold arrays of rack-mounted computing devices 514. Racks 505 are arranged non-linearly (e.g., in a rotationally symmetric array) to define chamber 500 and the interior chamber (shown in later views). Racks 505, in some embodiments, are "wedge racks" shaped to define the interior chamber when placed adjacent one another, for instance, by forming a wedge-shape in their horizontal cross section. In some embodiments, wedge racks 505 may be arranged into a shape such as a triangle, square, hexagon, or octagon with the back sides all facing towards (and in some cases partially or entirely defining) the interior chamber. In some embodiments, the chamber 500 may have a generally cylindrical shape, e.g., a circular cylindrical shape. In some embodiments, the chamber 500 may be generally rotationally symmetric about a vertical axis extending through the center of the chamber 500. In some embodiments, the interior chamber of datacenter chamber 500 (shown in FIGS. 3 and 4) may generally be of cylindrical shape. In some cases, the interior chamber of datacenter chamber 500 may define (e.g., approximate) a right cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa.

In some embodiments, chamber 500 provides front side rack access (the outer perimeter of the chamber) to access three categories of information technology interfaces (e.g., of computing devices 514): compute; network, and storage. In some embodiments, the components by which the computing devices are connected to power and one another may be accessible from the exterior of the chamber, e.g., the inner column may be generally or fully devoid of such connections, or alternate connections may be accessible from the exterior. (Or some embodiments may include such connections in the interior.)

In some embodiments, a lid 510 is configured to fit on top of the wedge racks. Lid 510 may include an upper portion 520 and a lower portion 516 (on the opposite side of the upper portion vertically) and an illumination strip 518, behind which may reside an array of light emitting diodes connected to a rack controller. Light color, intensity, and flashing rates or patterns may indicate status of computing devices in the rack. Lid 510 may define an empty chamber space located between lower portion 516 (where lid 510 and the wedge racks connect) and upper portion 520 of lid 510. The empty space may be house wiring and a top-of-rack network switch in some embodiments. In some cases, chamber 500 may include a leveling base 512 described with reference to FIGS. 11-13.

In some cases, the number of wedge racks 505 is at least three racks, e.g., five racks or six racks, or more. In some embodiments, each wedge rack 505 may be substantially identical to the other wedge racks, and each receptacle, called a "U" in each rack may be substantially identical to the others. In some embodiments, when assembled, the orientation of the wedge racks may differ by an amount less than 180 degrees, e.g., less than 90 degrees. In some embodiments, as described below, each wedge rack may be engineered with a holistic embedded systems engineering methodology to allow the rack to function as a "device"/"appliance", and not as a traditional rack/row architecture, which is expected to be particularly advantageous in web-scale applications. In some embodiments, chamber 500 may eliminate traditional "U's" of measurement by integrating the "pitch" into the chamber itself. That said, embodiments are not limited to systems that provide these benefits, as various independently useful techniques are described here, which is not to suggest that any other feature may not be omitted in some cases.

In some cases, the datacenter chamber 500 may house more than 50 U's of computing devices 514 and may span more than 5 feet in diameter (e.g., approximately 9 feet). Further, in some cases, the racks in the chamber may be approximately the height of a person, e.g., on the order of six feet tall to facilitate access by technicians (e.g., five feet or higher). In some embodiments, one or more datacenter chambers may be part of a modular data center that can be placed where data capacity is needed. This may allow for rapid deployment, energy efficiency, high-density computing, and cost reduction (though embodiments are also consistent with a non-modular design).

Figure 2:
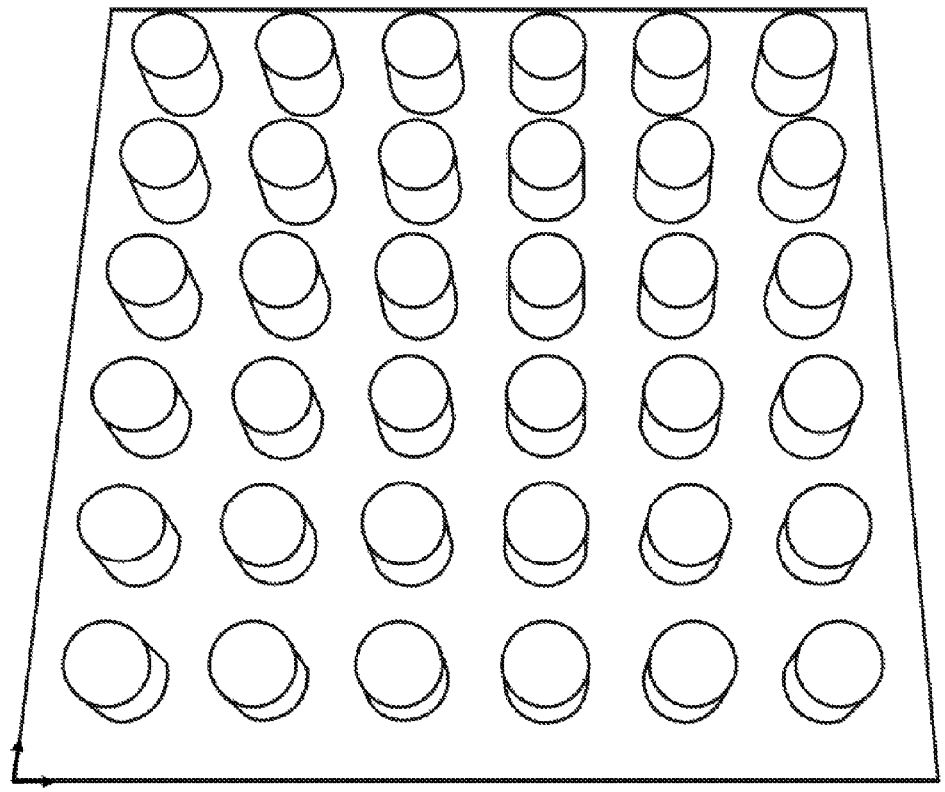
FIG. 2 illustrates a datacenter having an array of cylindrical datacenter chambers of FIG. 1, in accordance with some embodiments.

In some embodiments, a plurality of datacenter chamber 500 may be may be arranged in a datacenter. FIG. 2 illustrates an example of a datacenter having an array of cylindrical datacenter chambers. In some embodiments, the chambers may be arranged in a square or a hexagonal lattice, or other arrangements. In some cases, one or more datacenter chambers 500 may be added to existing data centers with or without similar characteristics (e.g., having different server rack units). In some embodiments, one or more datacenter chambers 500 may be containerized for easy transportation. For example, datacenter chambers 500 (with or without datacenter equipment) may be configured to fit into a standard shipping container, which is then transported to a desired location. Datacenter chamber 500 may be advantageous for use in portable data center environments at least because of its integrated cooling or ventilation system capacity as will be discussed below.

Controlling air temperature and humidity in the chamber (and in a datacenter in general) is expected to help protect equipment from malfunction and damage. In some cases it may also reduce power consumption and cost. For example, temperatures in a datacenter chamber 500 may rise because of the amount of power used in the datacenter chamber which may cause heat damage to equipment on the wedge racks. High humidity may cause water to condense on internal components within the datacenter chamber. Low humidity may cause static electricity discharge problems which may damage components within the datacenter chamber. A variety of arrangements may direct air to flow circumferentially inward or outward to cool rack-mounted computing equipment. In the illustrated embodiment, wedge racks 505 of chamber 500 (FIG. 1) are arranged into a cylindrical shape (or they may be arranged in other shapes described above such as a square, hexagon, or octagon with the back sides all facing towards the center). This, in some cases, allows outside cold air to be pulled (or pushed) in from several (e.g., all horizontal) directions to cool equipment in chamber 500. The cold (e.g., relative to the computing equipment) air may flow over the computing devices, drawing heat therefrom, and into the interior cylinder. From the cylinder, the air may be exhausted through a fan that drives the airflow as shown by the arrows in FIG. 3.

The incoming air is heated as it passes across heatsinks (pulling waste heat from computing equipment) and other warm components inside the equipment, in these embodiments. In some embodiments, the hot air exits the backs of the wedge racks and enters the inner chamber and exits through the top of the chamber. FIGS. 3-4 illustrate operation of the chamber of FIG. 1, in accordance with some embodiments. Cold air may be pulled or pushed from all directions of chamber 500, drawn to the inner chamber and exits through an exhaust output (e.g., output 522 of FIG. 4) in the top of chamber 500. (Or the flow may be reversed.) In some embodiments, a lid (e.g., lid 510 of FIG. 1) configured to cover the top of the chamber serves as a barrier that prevents the hot air from mixing back in with the cold air. In some embodiments, a fan 524 in FIGS. 3-4, or an array of fans may be arranged and positioned in the top of the lid and configured to pull the hot air upward. In some cases, the fan may be configured to pull the hot air into ductwork that routes the air elsewhere.

In some embodiments, chamber 500 may include dampers configured to adjust the flow of air. FIG. 3 illustrates an example of dampers 525. In some cases, dampers 525 in FIGS. 3 and 5, located at the base of the chamber may be used to adjust the flow of air. In some embodiments, the dampers may include one or more valves, or plates configured to control, stop, or regulate the flow of air inside chamber 500. In some embodiments, one or more dampers may be manual (e.g., using a manual handle to control the damper), or automatic (e.g., using motors that are controlled by a thermostat). Industry recommended temperatures generally range between 64 and 81° F., a dew point range between 41 and 59° F., and a maximum relative humidity of 60. In some embodiments, temperatures may range between 59 and 90° F.

In some embodiments, chamber 500 may include an integrated cooling system configured for directing air to flow circumferentially inward or outward to cool rack-mounted computing equipment, for instance, by driving a cooling fluid along computing devices mounted in the wedge racks of chamber 500 and through the interior chamber of chamber 500. The present techniques are described with reference to a cooling gas (air), but are consistent with other fluids, e.g., in systems immersed in mineral oil. In some embodiments, the integrated cooling system of chamber 500 is independent from other cooling systems (e.g., for other chambers in the datacenter, for the room where the datacenter is located, or for the building where the datacenter is located). In some cases, the integrated cooling system of chamber 500 may be controlled in concert with other cooling systems for other chambers, for the room or for the building. Cooling systems, humidifiers, ventilators, or other temperature and humidity control systems may be used to help control air temperature and humidity. In some embodiments, the integrated cooling system of chamber 500 may be configured to provide cooling and humidity control by directly drawing fresh air into the cooling system (e.g., through a vent, duct, etc.) In some embodiments, the integrated cooling system may be a portable cooling system. In other cases, the integrated cooling system maybe an integral part of chamber 500 (e.g., part of the chassis described below).

The integrated cooling system of chamber 500 may use one or more different techniques for forcing air to flow over computing equipment mounted in the wedge-shaped racks. For example, the cooling system may drive a cooling fluid (e.g., air, gas, water, chemicals, or other cooling fluids) along equipment in chamber 500 and through the interior chamber with a pump, like a centrifugal pump, in the case of liquids, or a fan, in the case of gasses. The cool fluid is heated as it passes through equipment and is driven out of the chamber. For example in case of air or other gasses, the heated fluid may be driven out by a fan located near an end of the interior chamber e.g., top (or located elsewhere within, or near to chamber 500) to a duct or a vent. Or in the case of cooling liquids, the heated liquid may be directed out of the chamber and into a heat exchanger using a pump.

For instance, in some embodiments, chamber 500 may include an integrated ventilation infrastructure. In some embodiments, the integrated ventilation infrastructure of chamber 500 is independent of other ventilation systems of other chambers, room, or building. In some cases, the integrated ventilation infrastructure may be controlled in concert with ventilation of other chambers in the datacenter, ventilation of the room, or building. In some embodiments, the ventilation infrastructure may include one or more fans in series or parallel. In some embodiments, the integrated ventilation infrastructure includes a plurality of motors attached to a fan through controlled clutches.

Figure 6:
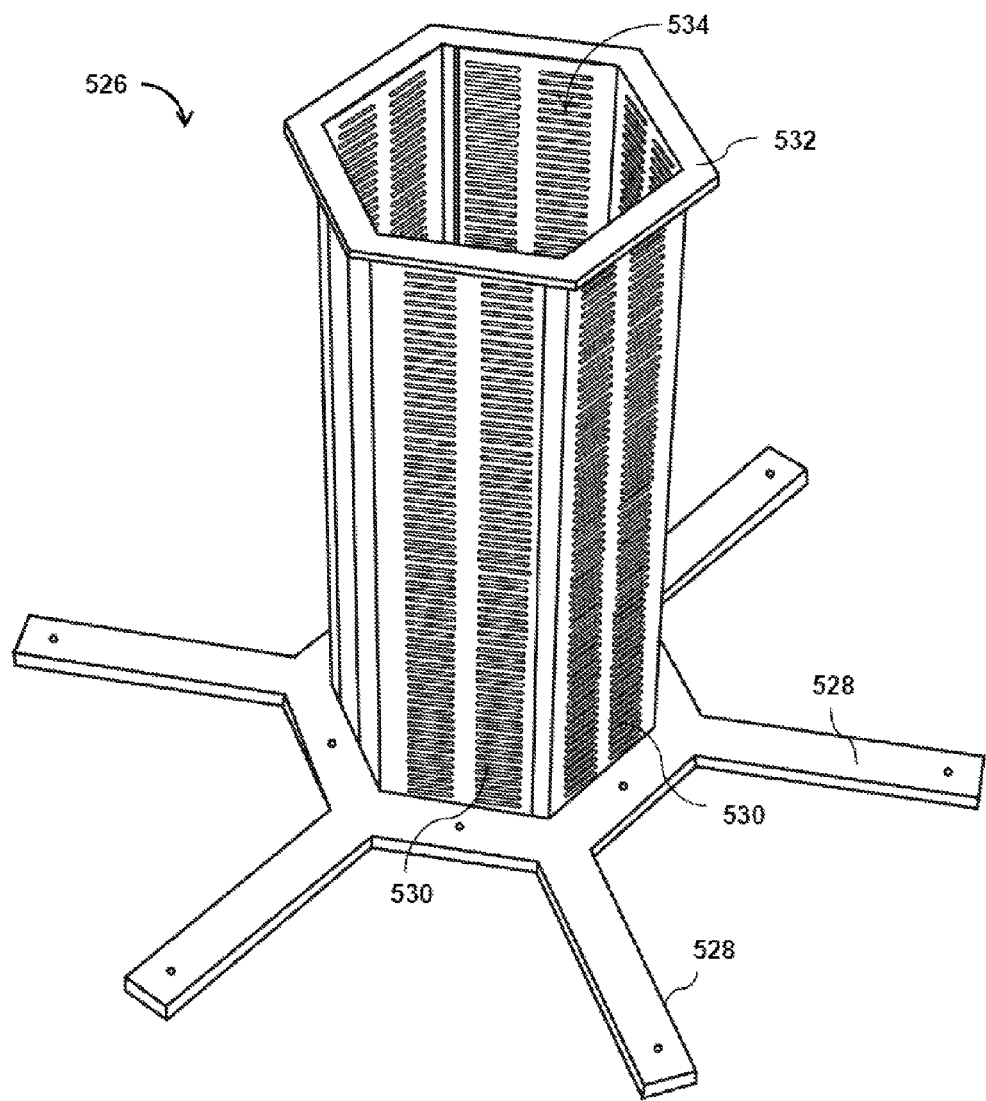
FIG. 6 illustrates a chassis of the cylindrical datacenter chamber of FIG. 1, in accordance with some embodiments.

FIG. 6 illustrates a chassis of the datacenter chamber 500 of FIG. 1, in accordance with some embodiments. Chassis 526 may be configured to secure one or more racks in spaced relation relative to one another. Chassis 526 may be configured to position the racks facing at least three different directions, e.g., six directions in the illustrated example. Wedge rack 536 (FIG. 7) is secured to chassis 526 such that chamber 536 is facing outward from the interior chamber defined by the back side of chamber 536 and the back side of other racks when secured to chassis 526. This may eliminate the need to reach the back side of the chamber (for maintenance, computing, networking, etc.), as opposed to existing rack cabinets which necessitate access to the back of the rack cabinets for operating some functions of the equipment, servicing, or securing the equipment. Existing rack cabinets are usually placed in single rows forming aisles between them to allow access to the back of the rack cabinets.

In some embodiments, chassis 526 includes a chamber brace 532 configured to connect to a leveling base 528 of chassis 526. Brace 532 is a multi-surface brace. Each surface is configured to receive a wedge rack. In some embodiments, brace 532 may be configured to fit within leveling base 528. In some cases brace 532 may be configured to fit on top of leveling base 528. In some embodiments, brace 532 and leveling base 528 may be configured to be removably connected (screws for example). In some embodiments, brace 532 and leveling base 528 may be permanently connected (e.g., welded, or permanently glued together).

In some embodiments, chassis 526 may include baffles 530/534 configured for directing air for an efficient air flow within chamber 500 (e.g., for cooling, ventilation, heat exchange, etc.) In some cases, the baffles may make airflow more uniform into or out of the chamber. Different rack-mounted computing devices may obstruct air differently, potentially leading to areas of high flow and other areas of low flow. The low flow areas may not be adequately cooled. To mitigate this issue, the baffles may constrain airflow and, thereby, account for a substantial portion of the pressure drop between the interior and exterior of the chamber. As a result, it is expected that computing-device specific differences in the pressure drop will account for a smaller portion of the total pressure drop, thereby evening fluid flow. In some embodiments, the baffles may be in the form of vanes, panels, orifices, or other forms. In some embodiments, the baffles may be one or more of longitudinal, horizontal, or other type of baffles.

In some embodiments, baffles 530/534 may include baffles configured to vary airflow restriction vertically along the length of the interior chamber to reduce the likelihood of positive pressure developing in the downstream end of the interior chamber. Positive pressure on what is intended to be the downstream side of the rack, in some use cases, is undesirable, as it can cause hot air to flow back from the interior chamber towards some of the racks, heating rather than cooling computing equipment. For instance, from the bottom of the interior chamber to the top of the interior chamber, the amount of airflow restriction provided may progressively increase, e.g., from an unobstructed region along one quarter of the length, to a partially obstructed region spanning the next quarter of the length, to an even more obstructed region spanning the next quarter of the length, and finally to a fully obstructed portion for the final quarter. A variety of structures may be used to partially obstruct airflow. Examples include arrays of holes drilled in a plate (like in a hexagonal lattice), with hole size and density decreasing as airflow obstruction increases. In some embodiments, airflow restriction may vary smoothly from one end of the chamber to the other, or separate portions may be defined. In some embodiments a filter media of increasing density may vary the resistance to airflow. In some embodiments the varying impediments to flow may be placed at the outer radius of the chamber or intermediate between the inner chamber and outer surface.

Figure 7:
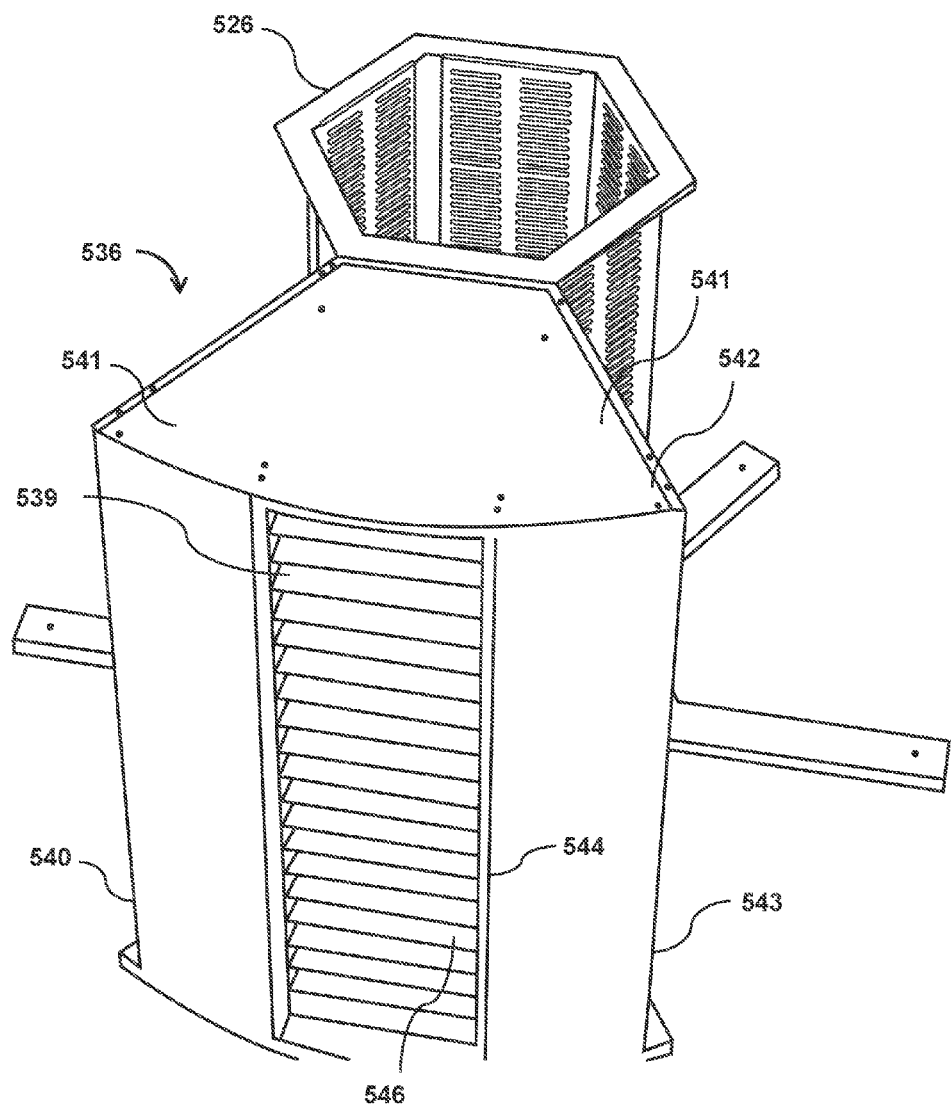
FIG. 7 illustrates a wedge rack of the cylindrical datacenter chamber of FIG. 1, in accordance with some embodiments.

FIG. 7 illustrates an example of a wedge rack 536 positioned on chassis 526. In this example, wedge rack 536 defines a generally wedge-shaped volume 541 along at least one side of the wedge rack. In some embodiments, the wedge rack comprises three articulating panels. A first panel 539 (not shown, but the element number identifies the area covered by the panel) may be configured to selectively provide access to a rack of computing devices 544, a second panel 540 configured to selectively provide access to a first wedge-shaped volume on one side of the rack of computing devices 544, and a third panel 543 configured to selectively provide access to a second wedge-shaped volume on a second side of the rack of computing devices. In some embodiments, computing devices may be disposed on equipment shelves 546. First panel 539 may provide front-side access (front side being the opposite side of a back side adjacent to the interior chamber) for compute, network, and storage interfaces for computing devices mounted in the racks. Wedge rack 536 may include wedge rack top cover 542 configured to fit on top of wedge 536. In some embodiments, top cover 542 may be removably connected to the top of wedge 536. In some cases, top cover 542 may be permanently connected to the top of wedge 536.

Figure 8:
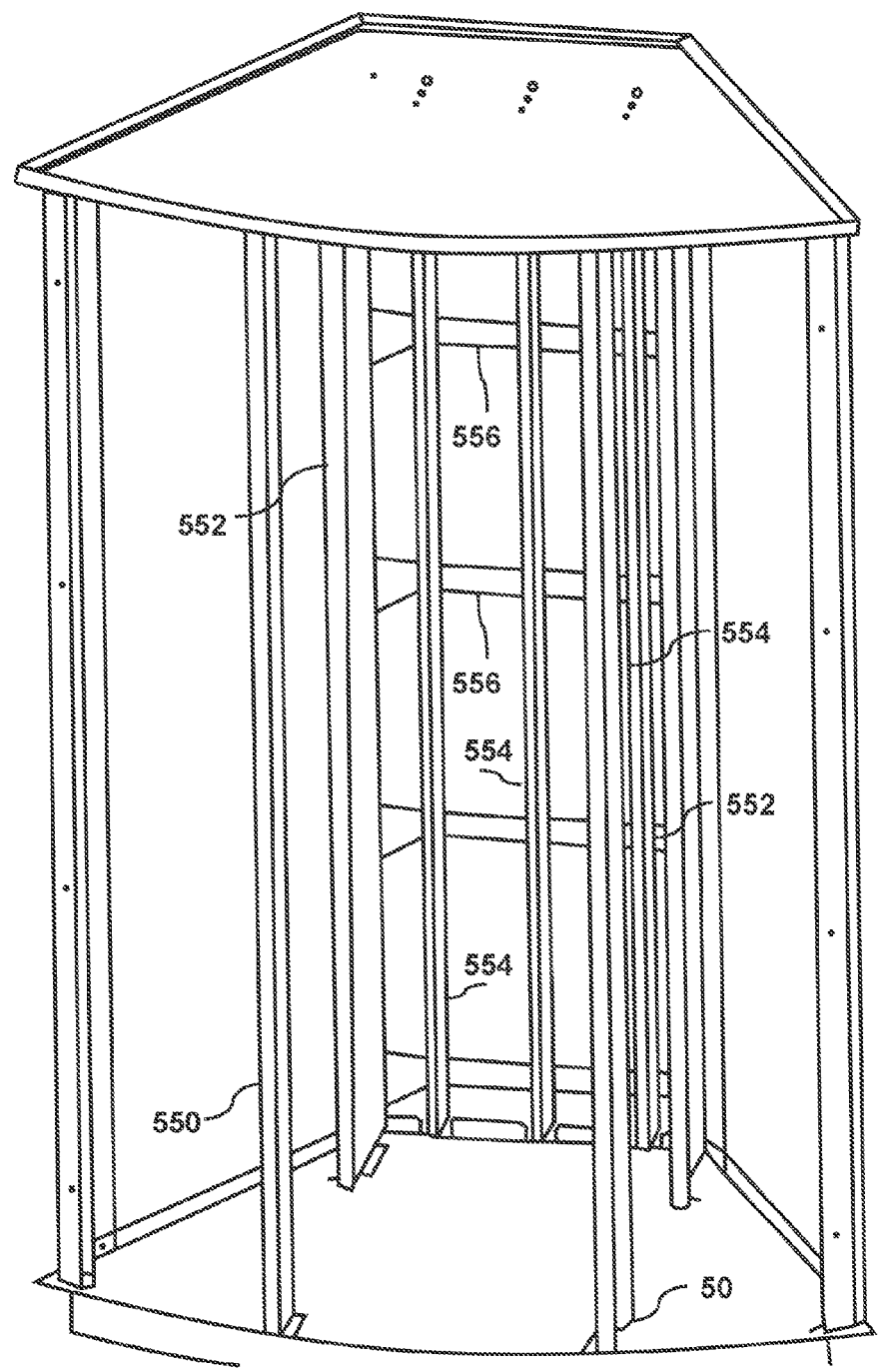
FIGS. 8-10 illustrate examples of components of the wedge rack of the cylindrical datacenter chamber of FIG. 1, in accordance with some embodiments.
Figure 9:
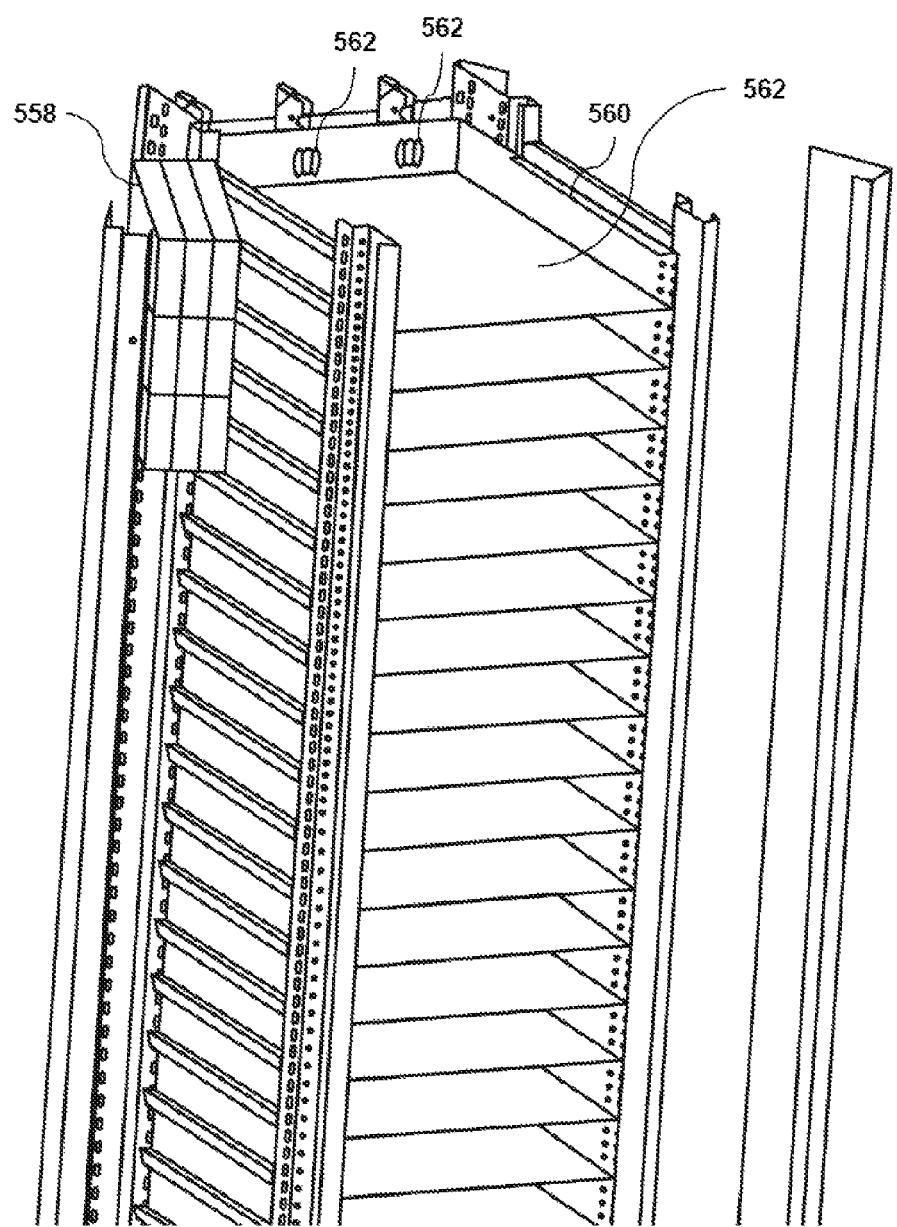
Figure 10:
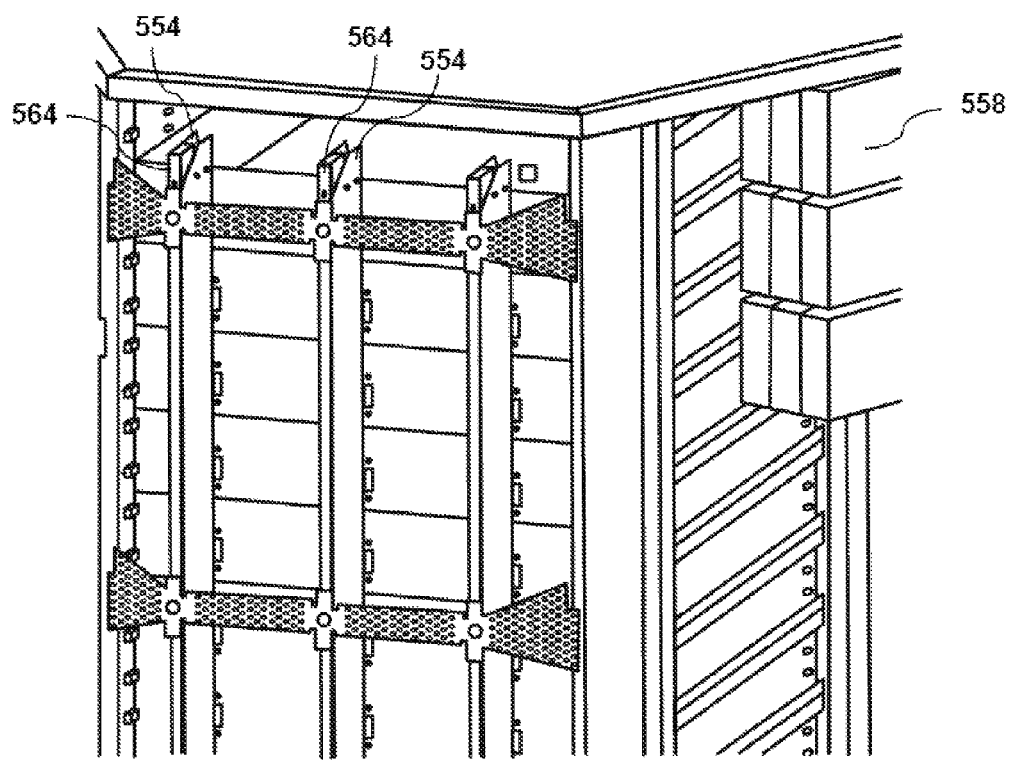
Figure 11:
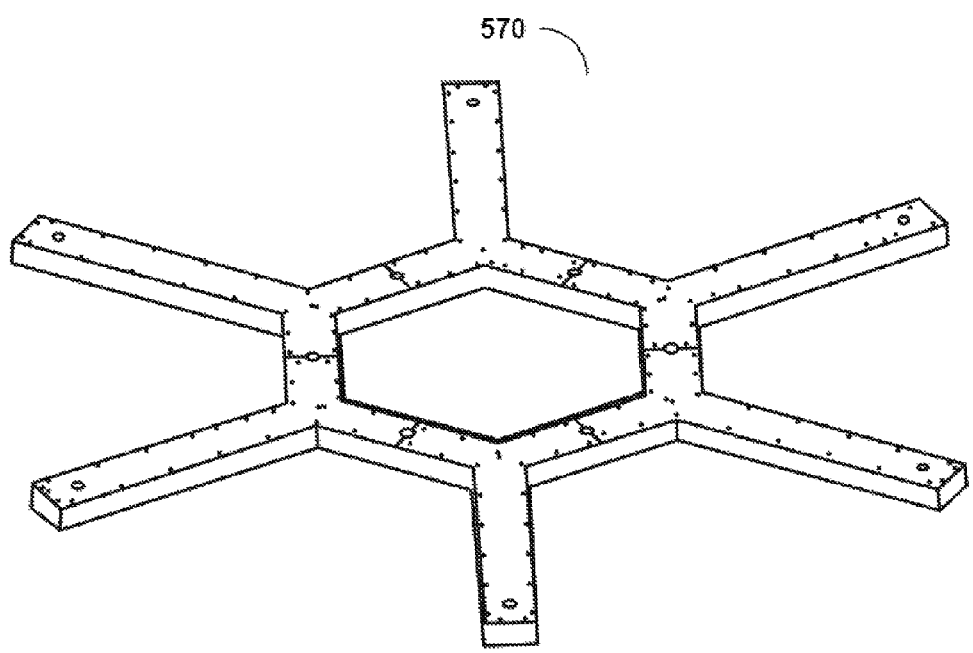
FIG. 11 illustrates a leveling base for the wedge racks of the cylindrical datacenter chamber of FIG. 1, in accordance with some embodiments.

FIGS. 8-10 illustrate examples of components of a wedge rack, in accordance with some embodiments. In some embodiments, wedge rack 536 includes a plurality of structural support elements configured to provide structural support and allow for heavy equipment mounting. For example, FIG. 8 shows rack front supports 550 located proximate an outer face of the wedge rack and extending vertically, rack rear support 552 located proximate to a back side of the wedge rack and extending vertically, and bus bar braces 556 extending horizontally and located proximate to a back side of the wedge rack adjacent the interior chamber coupled approximately perpendicular to rack rear support 552 and rack front support 550. A plurality of bus bars 554 may be disposed along the racks adjacent the interior chamber. Bus bar 554 may be connected to bus braces 556 (e.g., via screws).

The bus bars may be configured to distribute direct current (DC) power to at least some of the computing equipment by conducting electricity (e.g., direct current) within the racks, e.g., delivering power to rack mounted computing devices that establish electrical contact with the bus bars upon being slid into the rack. The bus bars may be in the form of a metallic strip or bar (e.g., copper, brass or aluminum), and the bus bars may be electrically isolated from the chamber chassis. In some embodiments, the bus bars may be of other shapes (e.g., flat strips, solid bars and rods, solid or hollow tubes, and braided wire). Some of these shapes allow heat to dissipate more efficiently due to their high surface area to cross-sectional area ratio. Hollow or flat shapes are prevalent in higher current applications. In some cases, the one or more bus bars may be enclosed in a bus duct. The material composition and cross-sectional size of the bus bar may determine the maximum amount of current that can be safely carried. In some embodiments, the bus bars may have insulators 564, or insulation may surround them in some cases to protect them from accidental contact. In some cases, bus bars may be enclosed in a metal housing, in the form of bus duct or busway, segregated-phase bus, or isolated-phase bus.

In some embodiments, chamber 500 may include a plurality of direct current (DC) bus bars for power distribution. Generally, rack-mounted computing equipment consumes DC power. Traditionally, in many cases each instance of equipment received alternative current (AC) power and converted the AC power to DC power with a dedicated power converter. This technique however can be expensive and generate additional heat near the computing equipment. Some embodiments may eliminate the need for the AC power converters by providing DC power. Or in some cases it can be expensive to power an AC voltage input power supply from the DC bus bar. In some embodiments, a bus bar power adapter may allow traditional AC voltage servers to be safely powered, and in some cases, controlled or monitored, via a DC power source.

In some embodiments, datacenter chamber 500 may include a backup power supply. In some cases, chamber 500 may include an integrated power infrastructure. For example, an uninterruptable power supply (UPS) that may be configured to provide uninterrupted power over some duration. In some embodiments, the power supply may be a battery-driven power supply (As shown in FIGS. 9-10 wedge rack 536 may include a rectifier or a battery module 558, such as the power supplies described below with reference to FIGS. 14-16). For example, a higher-voltage direct current (DC) power source, such as a battery may provide electrical power that is converted into a lower voltage, higher current DC power source. In some embodiments, the battery may be based on any of a variety of different chemistries. Examples include lead-acid, nickel-metal hydride, lithium ion, and the like. In some embodiments, other power sources may be used, such as fuel cells, banks of capacitors, and the like. The transformation may be effected by a DC-DC converter, such as a 48-volt to 12-volt DC-DC converter that receives 48-volt DC power at given current and produces 12-volt DC power at a substantially higher current. In some embodiments, the several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails. In some embodiments, the UPS may be controlled remotely.

In some embodiments, datacenter chamber 500 includes a plurality of computing devices disposed in the racks. The computing devices may be disposed on equipment trays 560. In some cases, trays 560 may have a plurality of openings on the back of the trays adjacent the inner chamber. The opening may be configured to facilitate connection of the equipment and bus bars. In some embodiments, the openings may include bus bar connectors (example 562 in FIG. 9). The computing devices may have stored thereon operating systems and user-applications (e.g., server applications, databases, load balancers, etc.)

In some embodiments, datacenter chamber 500 may include an integrated compute fabric configured to connect a plurality of computing devices within the chamber. The integrated compute fabric may be configured to connect the computing devices through interconnected nodes and links that look like a "fabric". The nodes may refer to processors, memory, or peripherals and the links may refer to functional connection between nodes. The integrated compute fabric may allow for high processing capabilities.

With some traditional systems, installations are difficult when racks are required to be positioned in relatively precise orientations in order to create a particular geometric shape or to direct airflow. To mitigate this issue, some embodiments use a modular and interlocking leveling base 570 (FIGS. 11-13) framework that serves to both level and to orient the racks into alignment, thus enabling the assembly of complex arrangements of racks with ease. That said, embodiments are not limited to systems that provide these benefits, as various independently useful techniques are described here, which is not to suggest that any other feature may not be omitted in some cases.

Figure 12:
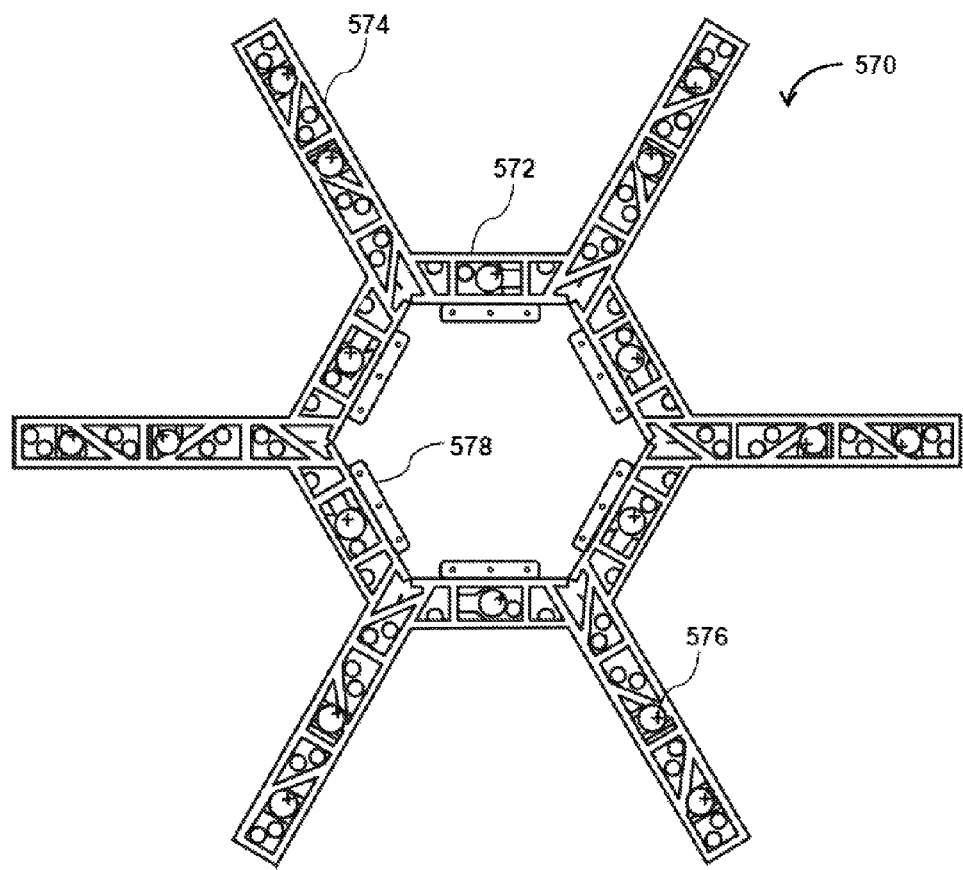
FIG. 12 is a bottom view of the leveling base of FIG. 11, in accordance with some embodiments.

In some embodiments, leveling base 570 includes a center piece 572 and a plurality of horizontally extending arms 574. Center piece 572 may be of hexagonal shape. Or in other cases, the leveling base may of triangular, square, pentagonal, hexagonal, heptagonal, octagonal, decagonal, dodecagonal, or other shapes. In some embodiments the leveling base is of the same shape as the base of chassis (described above). In some embodiments, the leveling base includes a plurality of modular sections configured to be connected together to form the leveling base (e.g., screws, rivets, etc.) This may help in shipping, installation and configuration of the leveling base. In some embodiments, the modular sections may be assembled on-site and then leveled to ensure even weight distribution across the floor. In some embodiments, leveling base 570 may be constructed of aluminum, steel, or a combination thereof to help keep the weight down. The leveling base may be bolted to the floor, using a plurality of bolting plates 578 (as shown in FIG. 12) located in the bottom side of the leveling base, to secure the structure in place to allow for installation and alignment of the racks. The bolting plates may be arranged such that they extend away from the leveling base towards the inner center section of the base.

In some embodiments, the bottom side of the leveling base includes a plurality of adjustable leveling feet 576 configured to level the base and, later when installed, the rest of the chamber. The adjustable leveling feet may be configured to be threaded in the leveling base to allow for adjusting the height of the leveling base and locking for the level of the base. Or other height-adjustable implements may be used, e.g., shims, wedges, hydraulic feet, ratchets, or interchangeable feet of different sizes. In some embodiments, each extending arm may include at least one adjustable leveling foot. In some cases, the leveling base may include a plurality of height-adjustable feet extending from the bottom of the base. In some cases, the height adjustable stands may be bolts threaded into a threaded interface of the base. The bolts extend downward to feet 576, the bolts being adjustable thereby adjusting the height of the feet. In some cases, before the racks are installed, the base may be leveled, so that the weight of the racks does not interfere with leveling.

Figure 13:
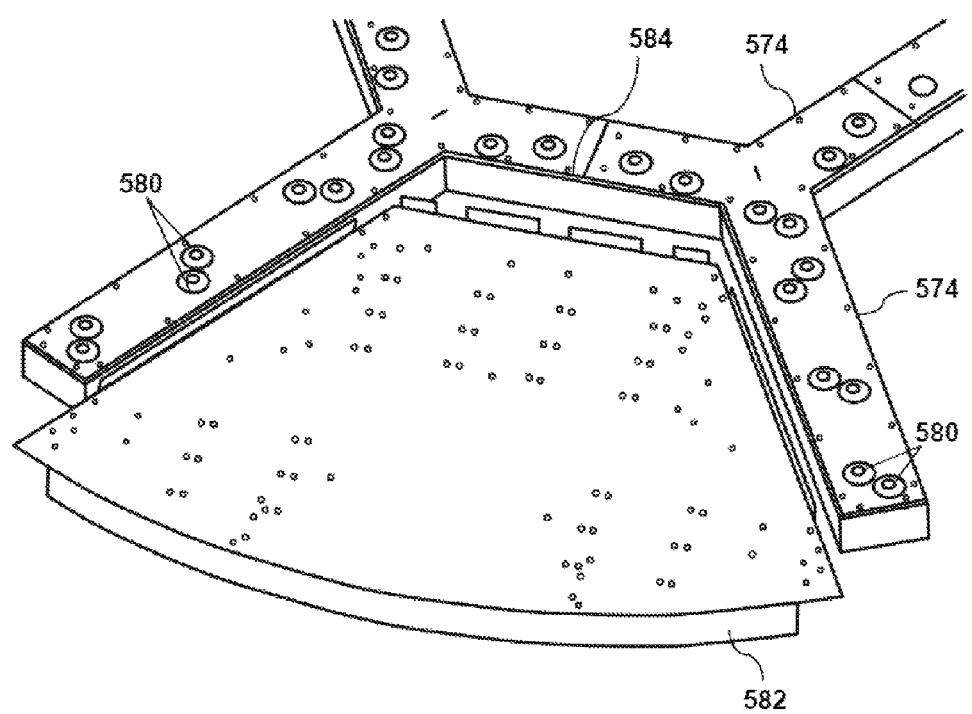
FIG. 13 is a view of a portion of the leveling base of FIG. 11, in accordance with some embodiments.

In some embodiments, as shown in FIG. 13, the upper side of the leveling base includes devices for reducing friction as a wedge-shaped rack is translated over the base. In this example, a plurality of ball bearings 580 located in the extending arms 574 and the center piece 572 of the leveling base 570. The ball bearings are configured to create a guide and support for the racks as they are lifted slightly and slide into place. In some embodiments, the ball bearings 580 include a steel ball seated in a socket. A portion of the ball may extend out of the socket and above the base, with the socket extending into the respective arm, so that less than half of the ball bearing extends above the top surface of the arm. In some cases, each ball bearing has a diameter of between one and three centimeters. In some embodiment, the socket may house a plurality of smaller bearings (e.g., between 2 and 5 millimeters) on which the exposed ball bearing rides to lower friction. Examples include an SP-30 ball transfer unit available from Ahcell of Taizhou, Jiangsu Province in China. In some embodiments, each extending arm may include eight ball bearings configured such that four ball bearings guide and support one bottom side of a rack and the other four ball bearings on the same arm are configured to guide and support one bottom side of an adjacent rack.

During installation of a wedge-rack, the wedge-rack may be translated (e.g., slid, rolled or carried) horizontally toward the interior chamber, between the respective arms receiving the unit. As the rack makes contact with the distal portion of the ball bearings extending upward from the arms, the bottom of the rack 582 may be lifted (in some cases by being slid against and up onto the ball bearings) and rolled on top of the ball bearing located on the arms located on each side of the bottom of the rack. Once on the ball bearing the bottom of the rack is pushed (with relatively little effort) such that the back side 584 of the bottom of the rack is on top of the ball bearing located on the center piece of the leveling base. As the rack is pushed backward a first force is generated translating the rack slightly upward, as the rack rolls onto the ball bearings. Then, as the rack rolls over the ball bearings, the rack may translate downward to sit on the leveling base, e.g., the bottom of the rack may include an indent to receive each ball bearings when in the proper position, thereby providing haptic feedback indicative of proper alignment.

Once in place, the bottom of the rack may be secured using an electronic latch, or a manual latch (e.g., a peg in a hole). In some embodiments, once the rack is in place a signal indicating that the rack is properly seated on the leveling arm may be generated (e.g., audible signal, visual signal, or other forms of signals). In some embodiments, a gasket sealer may be used to seal the racks side by side and to seal the back side of the rack to the chassis.

Alternatively or additionally, the leveling base may include air-casters configured to secure each of the racks to the leveling base. In some embodiments, air-casters may be created in the assembled leveling base such that they coincide with mating structures on the bottom side of the rack. The air-casters create a guide for the racks as they are lifted slightly and slid into place. Once in position, the rack is lowered onto the base and settles into the air-casters, which is expected to help with proper alignment. In some embodiments, other structures may reduce friction, e.g., Teflon™ bushings, bearings on the bottom of the rack, wheels on the top of the base or bottom of the rack, etc.

In some embodiments, the above-described rack-mounted computer assemblies may include a bus bar power adapter, such as bus bar power adapter described below with reference to FIGS. 14-15. In some embodiments, the bus bar power adapter may be a power adapter configured to replace an AC power adapter of computing equipment configured to receive AC power. Many rack mounted servers run off alternating current (AC) voltage input power supply and may require power wiring and power distribution units (PDUs) for AC distribution in the rack. With many prior techniques, it can be expensive to power an AC voltage input power supply from a direct current (DC) bus bar. Generally, traditional power supplies are used to convert AC power to DC power, for example 120 AC to 12 volts DC.

To mitigate these issues, or others, some embodiments include the depicted bus bar power adapter. In some embodiments, the bus bar power adapter may provide a similar power source to the rack mounted servers, for example, the bus bar power adapter may accept 12-volt DC power from the bus bar and provide the same type of output mating connection as the AC input power supply for the server, or other computing equipment. This technique is expected to allow traditional AC voltage computing equipment (i.e., computing equipment that is configured to be powered by AC power, notwithstanding AC-to-DC conversion performed by the equipment) to be safely powered, and in some cases, controlled or monitored, via a DC power source, for example DC bus bar for power distribution described in the applications incorporated by reference.

In some embodiments, the bus bar power adapter may provide power for the rack mounted computing equipment, and in some cases, the power supply may be hot swappable. For example, to avoid delays or operation interruptions, the bus bar power adapter may be hot swappable allowing change of configuration, repair, addition and removal without disruption of operations. In some cases, the bus bar power adapter may be added for redundancy, such that if another power supply fails the server keeps functioning with the bus bar power adapter while the other power supply is removed or replaced.

In some cases, the bus bar power adapter may provide the same type of output mating connection as an AC input hot swap power supply for the server. For example, the bus bar power adapter may be housed in an enclosure that mimics traditional power supplies for servers that slides in and locks the same way in some embodiments. This is expected to allow for use of existing equipment with server racks having DC bus bars without the need for new equipment compatible with theses server racks. In some embodiments, the bus bar power adapter may be housed in a protective standard enclosure to prevent contact with other components. The enclosure may include guide slots, pins, notches, or holes to allow for insertion of the bus bar power adapter into a server.

In some cases, the enclosure may include latches, handles, or release levers for easy mating and removal. In some embodiments, the enclosure may include more than one adapter. For example, several of the above bus bar power adapters may be placed in one enclosure. Or, in other cases, where the adapter does not include an enclosure, several adaptors may be configured to be connected to a server, for example, for redundancy or for load balancing.

In some embodiments, the bus bar power adapter may include sensors and control circuitry accessible via the power-line communication protocols described in the applications incorporated by reference. For instance, in some embodiments, power in, power out, voltage in, voltage out, current, temperature, etc. may be sensed, diagnostic tests may be performed, and the bus bar power adapter may be engaged or disengaged remotely.

Figure 14:
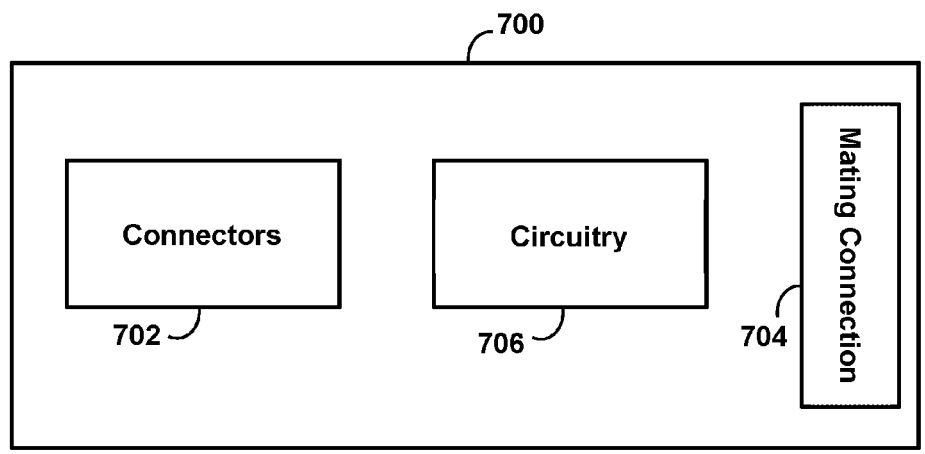
FIG. 14 illustrates a block diagram of an example of a bus bar power adapter, in accordance with some embodiments.

FIG. 14 illustrates a bus bar power adapter 700 that may mitigate some of the above-described issues with traditional power supplies, as well as, or in the alternative, provide other benefits described below. In some embodiments, the bus bar power adapter 700 is configured to operate in a computing environment, for example, as one of several power supplies disposed within (or adjacent, dedicated to, or coupled to) a rack of computing equipment, such as one or more of the above-described racks (or collections of racks, like a chamber). In some cases, each instance of computing equipment (e.g., one U) on the above-described racks may include one or more of a bus bar power adapter 700, e.g., within a chassis of the instance of computing equipment configured to be slid into the rack.

In some embodiments, bus bar adapter 700 may include connectors 702, output mating connection 704, and circuitry 706. Bus bar power adapter 700 may be configured to interface between power supply via connection 702, and computing equipment via connection 704. In some embodiments, circuitry 706 is configured to provide communication, sensing, monitoring, and control functionalities.

Bus bar adapter 700 components may be mounted on a printed circuit board in some cases, e.g., with a card edge power connection to the computing equipment. In some embodiments, bus bar power adapter 700 may be configured to interface between power supply and computing equipment on a rack similar to the racks described above with reference to FIG. 10. In some cases, the rack may include three pairs of direct current (DC) bus bars, each bus bar pair including two generally conductive straight rods (e.g., copper rods) extending in parallel in fixed relation (e.g., substantially so), such as within an inch of each other or less for each pair vertically along the back of a rack, and in some cases, each pair being more than four inches apart. In some cases, each of the 6 rods may be positioned in a generally parallel vertical plane at the back of a rack, such that rack computing equipment slid backwards into the rack may make electrical contact with the rods along the length of the rods (connecting the computer equipment to power concurrent with the equipment being posited in the rack in the same movement), and multiple computing devices may draw power from one or more of the pairs of bus bars. In some cases, the connection may be a blind connection.

In some embodiments, bus bar power adapter 700 may include one or more pairs of connectors 702 configured to electrically connect bus bar power adapter 700 to the bus bars. In some embodiments, connectors 702 connect to conductive insulated cables which make contact with one of the pairs of bus bars, for example gauge cables. In some embodiments, connectors 702 include a pair of contacts, a positive voltage contact and a negative voltage contact. In some cases, the pair of contacts are generally flat plates each one having a pair of generally circular holes configured to receive the conductive cables. In some embodiments, a bolt may be passed through a hole of a connector, and a threaded nut may secure the cable to the connector. In some cases, electrical cabling may include distal end with a generally flat plate with a generally circular hole (like a washer welded to the cable), and the bus bars may include a similar hole. In some cases, a bolt may be passed through the hole of the bus bar and the plate at the end of the cable, and a threaded nut may secure the cable to a respective one of the bus bar conductors.

In some embodiments, bus bar power adapter 700 may include standby voltage that is present all the time in one of the connectors whether or not a load is connected to adapter 700. For example, to allow for standby functions of adapter 700 to be powered. In other cases, bus bar power adapter 700 may provide a 5 V standby (5 VSB) voltage, or greater, so that the standby functions on the computing device (for example, remote control or digital clock) are powered.

In some embodiments, to provide a similar power source to the computing equipment, bus bar power adapter 700 accepts 12 VDC from the bus bar and provides the same type of output mating connection 704 as the AC input power supply for the server. In some embodiments, connection 704 may include staggered pins such that some pins are connected before others. In some embodiments, connection 706 includes staggered pins having ground pins that are longer than the other pins. The other pins may have the same length, or have two or more different lengths (e.g., such that ground connected first, data lines connected second, and power last). In some cases, the staggered pins include sense pins configured to sense when the connector is fully seated. In some embodiments, connection 704 may include pre-charge pins configured to make contact before the power pins. The pre-charge pins may be protected by a circuit (described below) configured to protect against inrush current to protect against pin damage. In some embodiments, the pin length difference may be very small, in millimeters, for example 0.5 mm. In operation, there may a delay when plugging adapter 700. For example, delay time between the long and the short pins contact may be between 25 ms and 250 ms.

In some embodiments, bus bar power adapter 700 may include a standardized connector 704 that fits in electronic industries alliance (EIA) gear to allow for use of existing gear in a different environment. For example, bus bar power adapter 700 described here may be used in other applications (e.g., cars).

Figure 15:
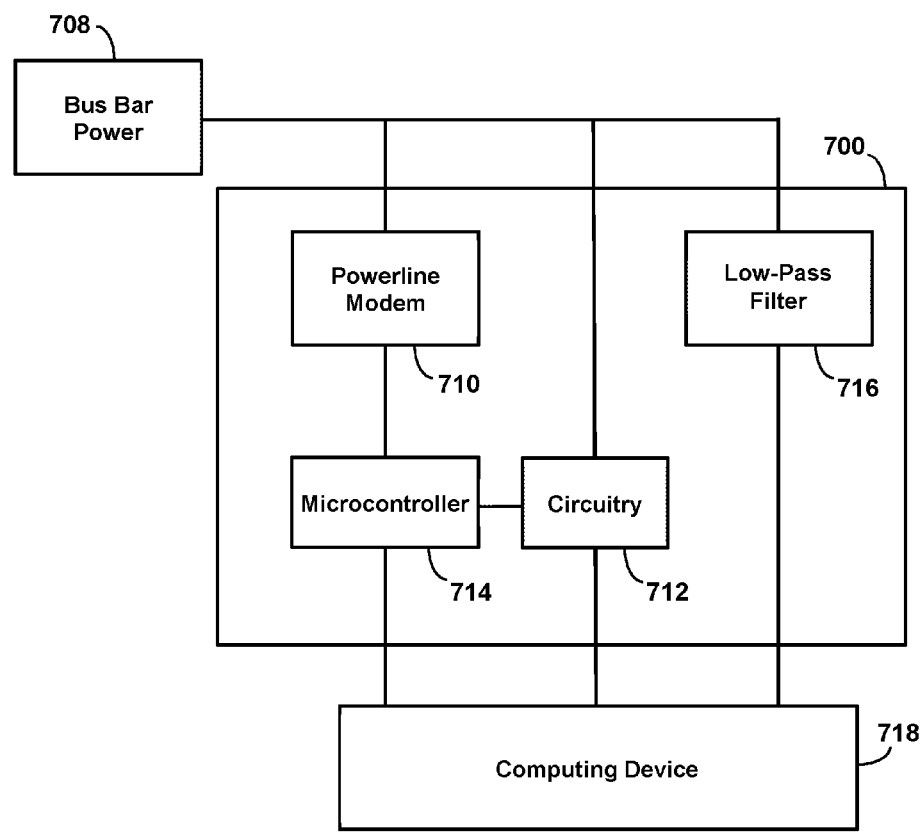
FIG. 15 is a block diagram of an example of a bus bar power adapter in accordance with some embodiments.

FIG. 15 illustrates an example of bus bar power adapter 700 in accordance with some embodiments. In some cases, bus bar power adapter 700 may support Power Management Bus (PMBus) for external real time monitoring of parameters such as power in, power out, voltage in, voltage out, etc. For example, bus bar power adapter 700 may include a powerline modem 710 including a microcontroller 714 that may be configured to retrieve monitoring information (e.g., sensor readings from circuitry 712) and send this information across the powerline. Several protocols may be used to retrieve or send information (e.g., Ethernet, rs485, zigBee, etc.) Such protocols may be implemented to retrieve or send information on a DC power bus or other physical media, e.g., wireless, or protocol-specific cabling in some cases. In some cases, the modem 710 includes a protocol-specific network adapter with a media access controller and transceiver (e.g., wired or a radio) configured to execute routines by which access to the media is arbitrated and information is conveyed in accordance with these protocols. In some embodiments, the bus bar power adapter 700 may provide power switching through microcontroller 714. In some embodiments, the adapter may include a kill switch to manually cut power to the server. Bus bar power adapter 700 may cut power to server while still having the hot-swapping functionality through the standby voltage. In some embodiments, the power can be cut remotely from other areas other than the local server. In some cases, the microcontroller may preserve power management bus (PMbus) functionality of the power supply. For example, the microcontroller may duplicate functionality and capability of the power supply to provide monitoring information that is retrievable by the computing device through cartridge connection (e.g., gathering information about input voltage, current usage, power usage, etc.). In some cases, the microcontroller may also receive commands via powerline and execute those commands, e.g., cutting power or re-engaging power.

In some embodiments, the microcontroller 714 is operative to receive signals from the powerline modem 710 and take responsive action. In some embodiments, the microcontroller 714 may receive commands from powerline modem 710 and implement those commands. In some cases, the commands may include accessing, configuration, or polling various sensors. For example, providing information that describes what sensors are available, their type, or their location, etc. Microcontroller 714 may implement some of the commands, for example, by querying or otherwise polling the various sensors to monitor things like voltage in, voltage out, current, resources being used by the computing device 718 (e.g., power usage), or environmental conditions, like temperature, vibrations, airflow, particulates, humidity, electromagnetic radiation, and the like. In some cases, the commands may include firmware upload or download. In some embodiments, a hardware device on rack-mounted computing equipment (like a hard drive, solid state drive, graphics processor, mother board, network interface card, memory controller, CPU, and the like) may include persistent memory (like flash memory) on which firmware is stored, and some embodiments of the microcontroller 714 may be configured to read a current version of the firmware from that memory, determine that an updated version of firmware has been received from a remote device, and write the updated version of firmware to the memory. In some embodiments, the firmware update may include the microcontroller 714 turning off the computing device at issue, installing the firmware, and then restarting the computing device. In some embodiments, the microcontroller 714 may be operative to drive various signals into the computing device 718 that reconfigure the computing device 718, monitor the computing device 718, or control the computing device 718. Examples include sending signals onto a system management bus or other bus of the computing device 718 that cause the computing device 718 to turn on, turn off, reconfiguring various settings, like clock speed or register settings for peripheral devices. In some embodiments, the microcontroller 714 is operative to poll various sensors that indicate the location of the rack computing device 718, for example, by reading a value with an optical sensor or a radio frequency sensor disposed on a rack that indicates the location of a rack computing unit 718 adjacent that device.

In some embodiments, microcontroller 714 may be a hot swap controller. The hot swap controller may provide short circuit protection and may limit sudden rush of current to reach a computing device being inserted into a live system (e.g., a live rack or chamber). This may prevent damaging the computing device and may eliminate the need to power the system down. In some embodiments, the hot swap controller 714 may control the delay time and allow for a stable period. For example, if fluctuation happens during the delay time period, the hot swap controller may be configured to reset the delay time and wait for stabilization before allowing the power to reach the server.

Circuitry 712 may provide under voltage, overvoltage, or overcurrent protection. For example in some embodiments, circuitry 712 may prevent overvoltage from reaching the server. Circuitry 712 may prevent power (in overvoltage conditions) from getting to mating connection 706. For example, in some cases, voltage supplied by the power supply may be higher than the server can tolerate. In other cases, a failure inside the power supply may result in a high voltage across the power adapter and to the server. Circuitry 712 may include an overvoltage protect circuit configured to detect overvoltage. This is expected to prevent damage to the server.

In some embodiments, the overvoltage circuit of circuitry 712 may be an electrical circuit that provides a short circuit or low resistance path across the voltage output of the bus bar power adapter such that once triggered, the overvoltage circuit pulls the voltage below a threshold level, (close to ground in some cases). For example, in some embodiments, a threshold (e.g., 12 VDC) voltage may be set such that, if the output voltage exceeds the threshold voltage level, the overvoltage circuitry trips (by switching via power mosfets, blowing a fuse or tripping a circuit breaker) and the bus bar adaptor pulls down the overvoltage on its output. In some cases, the overvoltage circuit of circuitry 712 may be configured to remove the short circuit once the transient is over. In some embodiments, the overvoltage circuit of circuitry 712 may be configured to prevent the output voltage from exceeding the threshold voltage level. In these embodiments, the overvoltage circuit may be used to adapt an input signal to a server that may be damaged by the signal range of the bus bar adaptor output. In some embodiments, protection can be provided by a circuit that provides a managed ramp-up of the DC supply voltage.

In some cases, if the need of power exceeds the power available through the bus bar adapter output a low voltage deficiency may occur. In some cases the low voltage may be in the form of short term fluctuations (e.g., a surge or a spike) which generally last for a very short period of time (e.g., a fraction of a second). In other cases, a low voltage condition may last for a few minutes, for example up to several hours. Under voltage may cause servers or other computing equipment connected to the bus bar adapter 700 to lose stability, fail or may cause data loss. To mitigate this problem, circuitry 712 may include an under voltage circuit. The under voltage circuit may prevent under voltage condition from reaching the server. For example, if incoming voltage is lower than a low voltage threshold (e.g., 2 VDC), under voltage circuit may be configured to not turn on the bus bar adapter output (e.g., the output may go into a standby mode) and when the incoming voltage is above the low voltage threshold the low voltage circuit release the output voltage. This is expected to avoid malfunctioning of servers connected to the bus bar power adapter.

In some embodiments, bus bar power adapter may include a low-pass filter 716 operative to shield, at least in part, computing equipment 718 from fluctuations in DC power on the DC power bus 708. The low-pass filter 716 may be operative to receive the DC power from the DC power bus 708, remove fluctuation and transmit a smooth, high quality DC power source to the computing device 718. A variety of techniques may be used to implement the low-pass DC filter 716. In some embodiments, an inductor may be placed in series between the bus 708 and the computing device 718 to provide a relatively large impedance therebetween. In other embodiments, the low-past DC filter 716 may also include a resistor placed in series between the bus 708 and the device 718, with a capacitor placed between a ground and high voltage signal of the bus to, again, provide an impedance to smooth fluctuations.

In some embodiments, bus bar power adapter 700 may include a DC-DC converter to provide power at other voltages, e.g., 12 VDC, or 3 VDC. For example, a 48-volt to 12-volt DC-DC converter that receives 48-volt DC power from bus bar 708 and produces 12-volt DC power. In some embodiments, the converter may be a switched-mode converter. In some embodiments, the converter may include a metal-oxide semiconductor field effect transistor coupled to an oscillator that periodically reverses polarity of the higher-voltage input DC power supply. In some embodiments, the converter may be a magnetic converter that includes an inverter that converts 48-volt DC current to alternative (AC) current, a transformer that steps down the voltage of the AC current, and a rectifier that converts the stepped-down AC current to a DC current. The converter may include a low-pass filter (e.g., a parallel-connected capacitor and serially connected resistor) that smooths voltage changes in the DC current at the lower voltage. In some embodiments, the power-conversion circuitry may generate a relatively large amount of heat. To dissipate this heat, circuitry may be mounted to a thermally conductive substrate, such as an aluminum circuit board having thereon a heat sink. Some embodiments may include components driving forced convection, such as fans, and baffles to direct waste heat.

In some embodiments, circuitry 712 may include an over current circuit configured to prevent against over current resulting from short circuit, fault current or overload. Current measurement can serve as a means for managing system thermal performance which may prevent system damage via fault detection. The over current circuit may indicate an over current condition or may control current in the event of an over-current condition. For example, over current circuit may be a simple series inductor, a negative temperature coefficient (NTC) resistor, a circuit breaker, or a current-limiter circuit configured to sense and limit the current. In some cases, the over current circuit may include a fuse or a relay configured to open if an over current condition is detected. For example, if the current is over an over-current threshold (e.g., 500 milliamperes) level the relay may open to prevent damaging the server connected to the bus bar adapter, and when the current drops below the over current threshold level.

In some embodiments, the powerline modem 710 may convey data over the DC power bus. In some cases, the DC bus bars both provide power to a plurality of rack mounted computing devices arrayed within a rack and serve as shared communication medium for those devices, via respective powerline modems 710. In some cases, the powerline modem includes a SIG60 powerline transceiver from Yamar Electronics Ltd. of Tel Aviv, Israel. In some cases, the transceiver may be configured to share the powerline medium with other devices, e.g., with time division or frequency division multiplexing. In some cases, the transceiver includes a data command message handler, a multi-phase modem, a sleep controller, a timing circuit, a reference voltage, and transmit and receive amplifiers.

Figure 16:
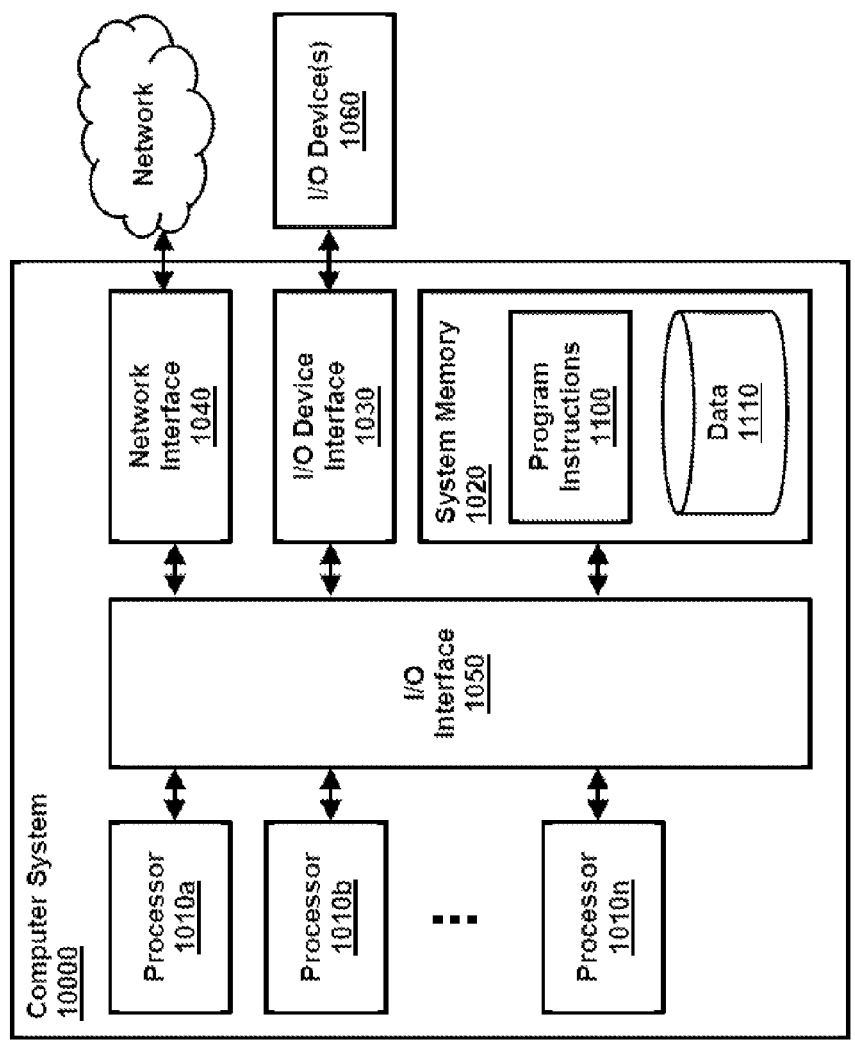
FIG. 16 illustrates components of a computing device that may be disposed and interconnected in the cylindrical datacenter chamber of FIG. 1.

FIG. 16 is a diagram that illustrates an exemplary computing system 1000 in accordance with embodiments of the present technique. In some cases, each U in each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A device configured to retrofit rack-mounted computing equipment designed to receive alternating current (AC) power from a rack for use with a rack configured to supply direct current (DC) power, device comprising: a power-supply adapter, comprising: a DC bus power interface configured to connect to two conductors at a rear side of a rack-mounted computing device and connecting to two DC bus conductors on a rear side of a rack; a hot swap controller electrically coupled to the DC bus power interface and comprising: an over voltage protection circuit; an under voltage protection circuit; and an over current protection circuit; and a rack-mounted computing device power interface electrically coupled to the hot swap controller and comprising an 6-or-more contact electrical connector configured to removably mate with a connector of a mother board or of an intermediate board of the rack-mounted computing device, wherein the power-supply adapter does not include an AC-to-DC power converter configured to power the rack-mounted computing device with rack-supplied AC power, and wherein the power-supply adapter is shaped to fit within a receptacle of the rack-mounted computing device for an AC-to-DC power adapter.

2. The device of embodiment 1, wherein the power-supply adapter is a monolithic part that is insertable into the rack-mounted computing equipment.

3. The device of any of embodiments 1-2, wherein the power-supply adapter comprises a powerline modem configured to receive commands via the DC bus.

4. The device of any of embodiments 1-3, wherein the 6-or-more contact electrical connector is an edge connector of a printed circuit board having contacts of varying width measured parallel to a connecting edge of the edge connector and varying distance from the connecting edge of the edge connector.

5. The device of any of embodiments 1-4, wherein the 6-or-more contact electrical connector comprises two conductors for a communication link with the motherboard.

6. The device of embodiment 5, comprising a power supply controller communicatively coupled the two conductors for the communication link with the motherboard, wherein the power supply controller is configured to receive a request for parameters of an AC-to-DC power supply from the motherboard and respond with values consistent with use of an AC-to-DC power supply and that do not impede operation of the motherboard.

7. The device of embodiment 5, comprising a power supply controller configured to receive an off command via the two conductors from the motherboard while in an on state and cease providing power on a first subset of the 6-or-more contacts while continuing to provide power on a second subset of the 6-or-more contacts.

8. The device of embodiment 7, wherein the power supply controller is configured to receive an on command via the two conductors while in an off state and, in response, start providing power on at least some of the first subset of the 6-or-more contacts of the connector.

9. The device of embodiment 5, comprising a fan and a power supply controller configured to receive a fan control signal via the two conductors from the motherboard and control the fan responsive to the fan control signal.

10. The device of any of embodiments 1-9, wherein the DC bus power interface comprises: a blind mating connector configured to mate with a bus bar extending vertically along the rear of a rack.

11. The device of any of embodiments 1-10, wherein the rack-mounted computing device power interface comprises: means for interfacing to an AC power supply interface of the rack-mounted computing device.

12. The device of any of embodiments 1-11, comprising a low-pass filter operative to shield, at least in part, the computing device from fluctuations in DC power on the DC bus.

13. The device of any of embodiments 1-12, comprising a controller that comprises: a communications interface; a microprocessor coupled to one or more sensors; and memory storing instructions that when executed by the microprocessor effectuate operations comprising: retrieving monitoring information; implementing commands; and driving various signals into the rack-mounted computing device.

14. The device of embodiment 13, wherein the monitoring information comprises information retrieved from power sensors or computing equipment sensors.

15. The device of embodiment 13, wherein the operations comprise: monitoring input voltage; and comparing the input voltage to a voltage threshold.

16. The device of embodiment 13, wherein the operations comprise: steps for monitoring input voltage and current of the DC bus.

17. The device of any of embodiments 1-16, comprising: a rack-mounted computing device coupled to the power-supply adapter via the rack-mounted comping device power interface.

18. The device of embodiment 17, comprising: a rack holding the rack-mounted computing device and a plurality of other rack-mounted computing devices, wherein the rack comprises a plurality of bus bars connected via a pair of conductors to the DC bus power interface.

19. The device of embodiment 18, wherein the rack comprises a plurality of AC-to-DC power converters configured to supply DC power to the bus bars, such a that the plurality of AC-to-DC power converters are configured to supply power to the power-supply adapter.

20. The device of any of embodiments 1-19, comprising the rack-mounted computing device, wherein the rack-mounted computing device stores program instructions of an operating system and an application executed by the rack-mounted computing device.

21. The device of embodiment 5, comprising a power supply controller configured to: receive a current draw or power usage query via the two conductors; obtain a current draw reading from a current sensor or a power usage reading from a power usage sensor; and respond with a value indicative of the current draw reading or the power usage reading.

What is claimed is:

1. A device configured to retrofit rack-mounted computing equipment designed to receive alternating current (AC) power from a rack for use with a rack configured to supply direct current (DC) power, device comprising:
   a power-supply adapter, comprising:
      a DC bus power interface configured to connect to two conductors at a rear side of a rack-mounted computing device and connecting to two DC bus conductors on a rear side of a rack;
      a hot swap controller electrically coupled to the DC bus power interface and comprising:
         an over voltage protection circuit;
         an under voltage protection circuit; and
         an over current protection circuit; and
      a rack-mounted computing device power interface electrically coupled to the hot swap controller and comprising an 6-or-more contact electrical connector configured to removably mate with a connector of a mother board or of an intermediate board of the rack-mounted computing device,
   wherein the power-supply adapter does not include an AC-to-DC power converter configured to power the rack-mounted computing device with rack-supplied AC power, and
   wherein the power-supply adapter is shaped to fit within a receptacle of the rack-mounted computing device for an AC-to-DC power adapter.

2. The device of claim 1, wherein the power-supply adapter is a monolithic part that is insertable into the rack-mounted computing equipment.

3. The device of claim 1, wherein the power-supply adapter comprises a powerline modem configured to receive commands via the DC bus.

4. The device of claim 1, wherein the 6-or-more contact electrical connector is an edge connector of a printed circuit board having contacts of varying width measured parallel to a connecting edge of the edge connector and varying distance from the connecting edge of the edge connector.

5. The device of claim 1, wherein the 6-or-more contact electrical connector comprises two conductors for a communication link with the motherboard.

6. The device of claim 5, comprising a power supply controller communicatively coupled the two conductors for the communication link with the motherboard, wherein the power supply controller is configured to receive a request for parameters of an AC-to-DC power supply from the motherboard and respond with values consistent with use of an AC-to-DC power supply and that do not impede operation of the motherboard.

7. The device of claim 5, comprising a power supply controller configured to receive an off command via the two conductors from the motherboard while in an on state and cease providing power on a first subset of the 6-or-more contacts while continuing to provide power on a second subset of the 6-or-more contacts.

8. The device of claim 7, wherein the power supply controller is configured to receive an on command via the two conductors while in an off state and, in response, start providing power on at least some of the first subset of the 6-or-more contacts of the connector.

9. The device of claim 5, comprising a fan and a power supply controller configured to receive a fan control signal via the two conductors from the motherboard and control the fan responsive to the fan control signal.

10. The device of claim 5, comprising a power supply controller configured to:
   receive a current draw or power usage query via the two conductors;
   obtain a current draw reading from a current sensor or a power usage reading from a power usage sensor; and
   respond with a value indicative of the current draw reading or the power usage reading.

11. The device of claim 1, wherein the DC bus power interface comprises:
   a blind mating connector configured to mate with a bus bar extending vertically along the rear of a rack.

12. The device of claim 1, wherein the rack-mounted computing device power interface comprises: means for interfacing to an AC power supply interface of the rack-mounted computing device.

13. The device of claim 1, comprising a low-pass filter operative to shield, at least in part, the computing device from fluctuations in DC power on the DC bus.

14. The device of claim 1, comprising a controller that comprises:
- a communications interface;
- a microprocessor coupled to one or more sensors; and
- memory storing instructions that when executed by the microprocessor effectuate operations comprising:
  - retrieving monitoring information;
  - implementing commands; and
  - driving various signals into the rack-mounted computing device.

15. The device of claim 14, wherein the monitoring information comprises information retrieved from power sensors or computing equipment sensors.

16. The device of claim 14, wherein the operations comprise:
- monitoring input voltage; and
- comparing the input voltage to a voltage threshold.

17. The device of claim 14, wherein the operations comprise: steps for monitoring input voltage and current of the DC bus.

18. The device of claim 1, comprising:
- a rack-mounted computing device coupled to the power-supply adapter via the rack-mounted comping device power interface.

19. The device of claim 18, comprising:
- a rack holding the rack-mounted computing device and a plurality of other rack-mounted computing devices, wherein the rack comprises a plurality of bus bars connected via a pair of conductors to the DC bus power interface.

20. The device of claim 19, wherein the rack comprises a plurality of AC-to-DC power converters configured to supply DC power to the bus bars, such a that the plurality of AC-to-DC power converters are configured to supply power to the power-supply adapter.

21. The device of claim 1, comprising the rack-mounted computing device, wherein the rack-mounted computing device stores program instructions of an operating system and an application executed by the rack-mounted computing device.

* * * * *